(12) United States Patent
Forrest et al.

(10) Patent No.: US 12,207,535 B2
(45) Date of Patent: Jan. 21, 2025

(54) PEEL-OFF PATTERNING METHOD FOR FABRICATION OF ORGANIC OPTOELECTRONIC DEVICES

(71) Applicant: The Regents of the University of Michigan, Ann Arbor, MI (US)

(72) Inventors: Stephen R. Forrest, Ann Arbor, MI (US); Xinjing Huang, Ann Arbor, MI (US); Dejiu Fan, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 17/684,168

(22) Filed: Mar. 1, 2022

(65) Prior Publication Data
US 2022/0278280 A1     Sep. 1, 2022

Related U.S. Application Data

(60) Provisional application No. 63/155,071, filed on Mar. 1, 2021.

(51) Int. Cl.
*H10K 71/20*     (2023.01)
*H10K 30/20*     (2023.01)
*H10K 30/81*     (2023.01)

(52) U.S. Cl.
CPC .......... *H10K 71/233* (2023.02); *H10K 30/20* (2023.02); *H10K 30/81* (2023.02)

(58) Field of Classification Search
CPC .............................. H10K 71/233; H10K 30/20
See application file for complete search history.

(56) References Cited

U.S. PATENT DOCUMENTS

| | | | |
|---|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Banerjee et al., "Application of laser-spectroscopy on organic photovoltaic devices", Lasers in Manufacturing Conference 2017. (Year: 2017).*

(Continued)

*Primary Examiner* — Tae-Sik Kang
(74) *Attorney, Agent, or Firm* — Riverside Law LLP

(57) ABSTRACT

A method of fabricating an organic optoelectronic device comprises positioning a patterning layer over a substrate, etching the patterning layer using a photolithographic process to create an etched patterning layer, positioning a layer of an organic material over the etched patterning layer, and removing at least a portion of the etched patterning layer and at least a portion of the layer of the organic material to create a patterned organic layer over the substrate.

20 Claims, 20 Drawing Sheets

(56) References Cited

U.S. PATENT DOCUMENTS

| | | | |
|---|---|---|---|
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2013/0026452 | A1 | 1/2013 | Kottas |
| 2013/0119354 | A1 | 5/2013 | Ma |
| 2015/0064628 | A1* | 3/2015 | Guo .......................... G03F 7/24 430/319 |

FOREIGN PATENT DOCUMENTS

| | | | |
|---|---|---|---|
| WO | 2004111066 | A1 | 12/2004 |
| WO | 2008044723 | | 4/2008 |
| WO | 2008057394 | A1 | 5/2008 |
| WO | 2010011390 | A2 | 1/2010 |
| WO | 2010111175 | | 9/2010 |

OTHER PUBLICATIONS

Chopra et al., "Thin-Film Solar Cells: An Overview", Prog. Photovolt: Res. Appl. 2004; 12:69-92. (Year: 2004).*

Abbas, A.S., Alqarni, S., Shokouhi, B.B., Abbas, A.S., Yavuz, M., and Cui, B. (2014). Metal and organic nanostructure fabrication by electron beam lithography and dry liftoff. Proc. IEEE Conf. Nanotechnol., 392-395.

Bai, Y., Zhao, C., Chen, X., Zhang, S., Zhang, S., Hayat, T., Alsaedi, A., Tan, Z., Hou, J., and Li, Y. (2019). Interfacial engineering and optical coupling for multicolored semitransparent inverted organic photovoltaics with a record efficiency of over 12%. J. Mater. Chem. A 7, 15887-15894.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 1, pp. 4-6 (1999).

Bernardo, G., Lopes, T., Lidzey, D.G., and Mendes, A. (2021). Progress in Upscaling Organic Photovoltaic Devices. Adv. Energy Mater. 11.

Burlingame, Q., Huang, X., Liu, X et al. Intrinsically stable organic solar cells under high-intensity illumination. Nature 573, 394-397 (2019).

Che, X. Z .; Li, Y. X .; Qu, Y .; Forrest, S. R. High fabrication yield organic tandem photovoltaics combining vacuum- and solutionprocessed subcells with 15% efficiency. Nature Energy 2018, 3, 422.

Chen, H., Zhang, R., Chen, X., Zeng, G., Kobera, L., Abbrent, S., Zhang, B., Chen, W., Xu, G., Oh, J., et al. (2021). A guest-assisted molecular-organization approach for >17% efficiency organic solar cells using environmentally friendly solvents. Nat. Energy 2021 611 6, 1045-1053.

Cui, Y., Xu, Y., Yao, H., Bi, P., Hong, L., Zhang, J., Zu, Y., Zhang, T., Qin, J., Ren, J., et al. (2021). Single-Junction Organic Photovoltaic Cell with 19% Efficiency. Adv. Mater. 33, 2102420. 8 pages.

Cui, Y., Yao, H., Zhang, J., Xian, K., Zhang, T., Hong, L., Wang, Y., Xu, Y., Ma, K., An, C., et al. (2020). Single-Junction Organic Photovoltaic Cells with Approaching 18% Efficiency. Adv. Mater. 32. 7 pages.

Defranco, J.A., Schmidt, B.S., Lipson, M., and Malliaras, G.G. (2006). Photolithographic patterning of organic electronic materials. Org. Electron. 7, 22-28.

Distler, A., Brabec, C.J., and Egelhaaf, H.J. (2021). Organic photovoltaic modules with new world record efficiencies. Prog. Photovoltaics Res. Appl. 29, 24-31.

Dong, S., Jia, T., Zhang, K., Jing, J., and Huang, F. (2020). Single-Component Non-halogen Solvent-Processed High-Performance Organic Solar Cell Module with Efficiency over 14%. Joule 4, 2004-2016.

Dong, X., Jiang, Y., Sun, L., Qin, F., Zhou, X., Lu, X., Wang, W., Zhou, Y., Dong, X.Y., Jiang, Y.Y., et al. (2021). Large-Area Organic Solar Modules with Efficiency Over 14%. Adv. Funct. Mater., 2110209. 8 pages.

Heo, Y.-J., Jung, Y.-S., Hwang, K., Kim, J.-E., Yeo, J.-S., Lee, S., Jeon, Y.-J., Lee, D., and Kim, D.-Y. (2017). Small-Molecule Organic Photovoltaic Modules Fabricated via Halogen-Free Solvent System with Roll-to-Roll Compatible Scalable Printing Method. ACS Appl. Mater. Interfaces 9, 39519-39525.

Huang, X., Zhang, L., Cheng, Y., Oh, J., Li, C., Huang, B., Zhao, L., Deng, J., Zhang, Y., Liu, Z., et al. (2021). Novel Narrow Bandgap Terpolymer Donors Enables Record Performance for Semitransparent Organic Solar Cells Based on All-Narrow Bandgap Semiconductors. Adv. Funct. Mater., 2108634. 10 pages.

Ilic, B., and Craighead, H.G. (2000). Topographical patterning of chemically sensitive biological materials using a polymer-based dry lift off. Biomed. Microdevices 2, 317-322.

Jeong, H.I., Biswas, S., Yoon, S.C., Ko, S .- J., Kim, H., and Choi, H. (2021). Rational Design of Highly Efficient Semi-Transparent Organic Photovoltaics with Silver Nanowire Top Electrode via 3D Optical Simulation Study. Adv. Energy Mater., 2102397. 8 pages.

Kubis, P., Li, N., Stubhan, T., Machui, F., Matt, G.J., Voigt, M.M., and Brabec, C.J. (2015). Patterning of organic photovoltaic modules by ultrafast laser. Prog. Photovoltaics Res. Appl. 23, 238-246.

Kutsarov, D.I., New, E., Bausi, F., Zoladek-Lemanczyk, A., Castro, F.A., and Silva, S.R.P. (2017). Fabrication of air-stable, large-area, PCDTBT:PC70BM polymer solar cell modules using a custom built slot-die coater. Sol. Energy Mater. Sol. Cells 161, 388-396.

Li, et al., "High Efficiency Near-Infrared and Semitransparent Non-Fullerene Acceptor Organic Photovoltaic Cells", J. Am. Chem. Soc., 2017, 139, 17114-17119.

Li, Y., Guo, X., Peng, Z., Qu, B., Yan, H., Ade, H., Zhang, M., and Forrest, S.R. (2020). Color-neutral, semitransparent organic photovoltaics for power window applications. Proc. Natl. Acad. Sci. U. S. A. 117, 21147-21154.

Li, Y., Huang, X., Ding, K., Sheriff, H.K.M., Ye, L., Liu, H., Li, C.-Z., Ade, H., and Forrest, S.R. (2021). Non-fullerene acceptor organic photovoltaics with intrinsic operational lifetimes over 30 years. Nat. Commun. 2021 121 12, 1-9.

Li, Y., Ji, C., Qu, Y., Huang, X., Hou, S., Li, C., Liao, L., Guo, L. J. & Forrest, S.R. Enhanced Light Utilization in Semitransparent Organic Photovoltaics Using an Optical Outcoupling Architecture. Adv. Mater. 31, 1-8 (2019).

Lim, D.C., Jeong, J.H., Hong, K., Nho, S., Lee, J.-Y., Hoang, Q.V., Lee, S.K., Pyo, K., Lee, D., and Cho, S. (2018). Semi-transparent plastic solar cell based on oxide-metal-oxide multilayer electrodes. Prog. Photovoltaics Res. Appl. 26, 188-195.

Liu, Q., Gerling, L.G., Bernal-Texca, F., Toudert, J., Li, T., Zhan, X., and Martorell, J. (2020). Light Harvesting at Oblique Incidence Decoupled from Transmission in Organic Solar Cells Exhibiting 9.8% Efficiency and 50% Visible Light Transparency. Adv. Energy Mater. 9 pages.

Lucera, L., Kubis, P., Fecher, F.W., Bronnbauer, C., Turbiez, M., Forberich, K., Ameri, T., Egelhaaf, H.J., and Brabec, C.J. (2015). Guidelines for Closing the Efficiency Gap between Hero Solar Cells and Roll-To-Roll Printed Modules. Energy Technol. 3, 373-384.

Lucera, L., Machui, F., Kubis, P., Schmidt, H.D., Adams, J., Strohm, S., Ahmad, T., Forberich, K., Egelhaaf, H.J., and Brabec, C.J. (2016). Highly efficient, large area, roll coated flexible and rigid OPV modules with geometric fill factors up to 98.5% processed with commercially available materials. Energy Environ. Sci. 9, 89-94.

Lucera, L., Machui, F., Schmidt, H.D., Ahmad, T., Kubis, P., Strohm, S., Hepp, J., Vetter, A., Egelhaaf, H.J., and Brabec, C.J. (2017). Printed semi-transparent large area organic photovoltaic modules with power conversion efficiencies of close to 5 %. Org. Electron. 45, 209-214.

(56) References Cited

OTHER PUBLICATIONS

Lunt, R. R.; Bulovic, V. Transparent, near-infrared organic photovoltaic solar cells for window and energy-scavenging applications. Applied Physics Letters 2011, 98, 113305, 5 pages.

Martinez, D., Py, C., Denhoff, M., Monette, R., Comas, T., Krantis, A., and Mealing, G. (2013). Polymer peel-off mask for high-resolution surface derivatization, neuron placement and guidance. Biotechnol. Bioeng. 110, 2236-2241.

Meiss, J., Holzmueller, F., Gresser, R., Leo, K., and Riede, M. (2011). Near-infrared absorbing semitransparent organic solar cells. Appl. Phys. Lett. 99, 10-13.

Meng et al., "Organic and solution-processed tandem solar cells with 17.3% efficiency", Science vol. 361, Issue 6407, pp. 1094-1098; Sep. 14, 2018; [online] <https://science.sciencemag.org/content/361/6407/1094.full > 5 pages.

Pascual-San-José, E., Sadoughi, G., Lucera, L., Stella, M., Martínez-Ferrero, E., Morse, G.E., Campoy-Quiles, M., and Burgués-Ceballos, I. (2020). Towards photovoltaic windows: Scalable fabrication of semitransparent modules based on non-fullerene acceptorsvialaser-patterning. J. Mater. Chem. A 8, 9882-9895.

Rowell, M.W., and McGehee, M.D. (2011). Transparent electrode requirements for thin film solar cell modules. Energy Environ. Sci. 4, 131-134.

Sheriff, H. K. M., Li, Y., Qu, B. & Forrest, S. R. Aperiodic optical coatings for neutral-color semi-transparent organic photovoltaics. Appl. Phys. Lett. 118, (2021). 15 pages.

Strohm, S., Machui, F., Langner, S., Kubis, P., Gasparini, N., Salvador, M., McCulloch, I., Egelhaaf, H.J., and Brabec, C.J. (2018). P3HT: Non-fullerene acceptor based large area, semi-transparent PV modules with power conversion efficiencies of 5%, processed by industrially scalable methods. Energy Environ. Sci. 11, 2225-2234.

Tan, C.P., Cipriany, B.R., Lin, D.M., and Craighead, H.G. (2010). Nanoscale Resolution, Multicomponent Biomolecular Arrays Generated By Aligned Printing With Parylene Peel-Off. Nano Lett. 10, 719-725.

Tan, C.P., Ri Seo, B., Brooks, D.J., Chandler, E.M., Craighead, H.G., and Fischbach, C. (2009). Parylene peel-off arrays to probe the role of cell-cell interactions in tumour angiogenesis. Integr. Biol. 1, 587-594.

Wang, D., Qin, R., Zhou, G., Li, X., Xia, R., Li, Y., Zhan, L., Zhu, H., Lu, X., Yip, H.L., et al. (2020). High-Performance Semitransparent Organic Solar Cells with Excellent Infrared Reflection and See-Through Functions. Adv. Mater. 32, 2001621. 8 pages.

Wang, G., Adil, M.A., Zhang, J., and Wei, Z. (2019). Large-Area Organic Solar Cells: Material Requirements, Modular Designs, and Printing Methods. Adv. Mater. 31, 1-34.

Xinjing Huang, Dejiu Fan, Stephen R. Forrest, Scalable semitransparent prototype organic photovoltaic module with minimal resistance loss, Organic Electronics, vol. 97, 2021, 106276, ISSN 1566-1199, https://doi.org/10.1016/j.orgel.2021.106276.

Zou, C., Chang, C., Sun, D., Böhringer, K.F., and Lin, L.Y. (2020). Photolithographic patterning of perovskite thin films for multicolor display applications. Nano Lett. 20, 3710-3717.

\* cited by examiner

701

702

703

704

705

1151

Pattern ITO cathode and polyimide (PI)

1152

Deposit ZnO, organic BHJ and MoO$_x$ layers

1153

Peel off right PI strip

PEEL-OFF PATTERNING METHOD FOR FABRICATION OF ORGANIC OPTOELECTRONIC DEVICES

CROSS-REFERENCE TO RELATED APPLICATIONS

This application claims priority to U.S. Provisional Application No. 63/155,071, filed on Mar. 1, 2021, incorporated herein by reference in its entirety.

STATEMENT REGARDING FEDERALLY SPONSORED RESEARCH OR DEVELOPMENT

This invention was made with government support under DE-EE0008561 awarded by the U.S. Department of Energy. The government has certain rights in the invention

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, may be used to drive power consuming loads to provide, for example, lighting, heating, or to power electronic circuitry or devices such as calculators, radios, computers or remote monitoring or communications equipment. These power generation applications may involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or subcells.

In addition to the pursuit of high device efficiency, OPVs have unique advantages, such as the application of semi-transparent solar cells for use in building integrated photovoltaics (BIPV). Considering the vast surface areas of windows and facades in modern urban environments, developing semi-transparent solar cells with both high efficiency and transmittance has become increasingly important.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. A dendrimer may be a "small molecule," and it is believed that all dendrimers currently used in the field of organic opto-electronic devices are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of a material. A ligand may be referred to as "ancillary" when it is believed that the ligand does not contribute to the photoactive properties of a material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower"

energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Over the past few years, OPVs have been demonstrated with high power conversion efficiency (PCE) and exceptional stability. In addition to their impressive performance, OPVs allow for transparency across the visible spectrum with selective absorption in the near-infrared (NIR) due to the relatively narrow excitonic absorption spectra of organic semiconductors, making them suitable for power generating windows on buildings. With the development of NIR-absorbing materials and optical coatings, semitransparent OPVs (ST-OPVs) have undergone a substantial increase in both PCE and average photopic transmission (APT), achieving a light utilization efficiency of LUE=PCE×APT as high as 5%.

However, these achievements have generally been demonstrated on small, laboratory-scale devices. To realize practical applications, scalable fabrication processes of modules with minimal loss in power generation need to be established. Considerable loss in OPV module efficiencies arises from the large area consumed by interconnections between constituent cells. Conventional patterning techniques include mechanical scribing, shadow masking, gravure printing, slot-die coating, etc. However, these often yield interconnection widths at the millimeter scale, and result in a low geometric fill factor (GFF), which is the ratio between the active cell and the total module areas. In contrast, laser ablation has achieved interconnection widths of hundreds of microns. However, this technique requires illumination at wavelengths and pulse durations that must be tailored to the specific materials and layer thicknesses used, to ablate only the target layer without damaging other materials comprising the cell. The highest efficiency opaque OPV modules fabricated with laser ablation show around 10% PCE loss compared to laboratory-scale devices due to manufacturing imperfections.

An alternative to these methods is photolithographic patterning. However, commonly used photoresists often contain solvents that can degrade chemically sensitive organic materials. Moreover, lithographic patterning and photoresist removal usually employ reactive ion or solvent-based wet chemical processes. These steps can damage most organic materials, and thus, photolithography has not been employed for fabricating OPV modules.

A solvent-free patterning method capable of maintaining high geometric fill factor (GFF) of large-scale optoelectronic device modules, for example organic solar panels, would alleviate some of these difficulties. Current patterning approaches are usually limited to GFFs lower than 90% in such modules (e.g., organic, perovskite optoelectronic devices) due to relatively large areas (sub-millimeter scale) reserved for device separation and interconnection.

SUMMARY OF THE INVENTION

In one aspect, a method of fabricating an organic optoelectronic device comprises positioning a patterning layer over a substrate, etching the patterning layer using a photolithographic process to create an etched patterning layer, positioning a layer of an organic material over the etched patterning layer, and removing at least a portion of the etched patterning layer and at least a portion of the layer of the organic material to create a patterned organic layer over the substrate.

In one embodiment, the etched patterning layer includes a portion having a width of between 1 µm and 10 mm. In one embodiment, the etched patterning layer comprises a void having a width of between 1 µm and 10 mm. In one embodiment, the patterning layer comprises a polymer. In one embodiment, the method further comprises applying a surface treatment in an interface between the substrate and the patterning layer. In one embodiment, the etching step comprises the steps of positioning a photoresist layer over the patterning layer, positioning a mask over the photoresist layer, exposing a portion of the photoresist layer to light through the mask, and removing at least a portion of the patterning layer.

In one embodiment, the substrate comprises a first electrode. In one embodiment, the method further comprises positioning a second electrode over the patterned organic layer. In one embodiment, the method further comprises the step of removing a second portion of the patterning layer and a portion of the second electrode to create a patterned second electrode over the substrate. In one embodiment, a portion of the patterned second electrode is electrically connected to a portion of the patterned first electrode. In one embodiment, the patterning layer comprises a thin strip of material having a width of less than 100 µm, connected at a distal end to a wedge-shaped handle, the wedge having a tapered shape at a proximal end beginning with a width of at least ten times the width of the thin strip and ending with a width at the distal end equal to the width of the thin strip of material. In one embodiment, an organic photovoltaic cell is made using the methods disclosed herein.

In one aspect, a method of fabricating an organic optoelectronic device comprises coating a patterning layer over a first electrode layer, photolithographically etching the patterning layer to comprise at least one pair of thin strips comprising first and second thin strips with a separation between the first and second strips, depositing a heterojunction layer over the patterning layer, peeling off the first thin strip of each of the at least one pair of thin strips, removing a portion of the heterojunction layer, depositing a second electrode over the heterojunction layer, and peeling off the second thin strip of each of the at least one pair of thin strips, removing a portion of the anode.

In one embodiment, the method further comprises applying a surface treatment at an interface between the patterning layer and the first electrode layer. In one embodiment, the thin strips have a width of less than 100 µm. In one embodiment, the separation between the first and second thin strips in the at least one pair of thin strips is less than 100 µm. In one embodiment, the first electrode layer is a cathode and the second electrode layer is an anode. In one embodiment, at least one of the peeling steps comprises rolling the respective thin strip onto a roller and moving the roller along a plane parallel to the first electrode layer. In one embodiment, at least a portion of the second electrode layer is electrically connected to at least a portion of the first electrode layer. In one embodiment, an organic photovoltaic cell is made using the methods disclosed herein.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

Figure 1:
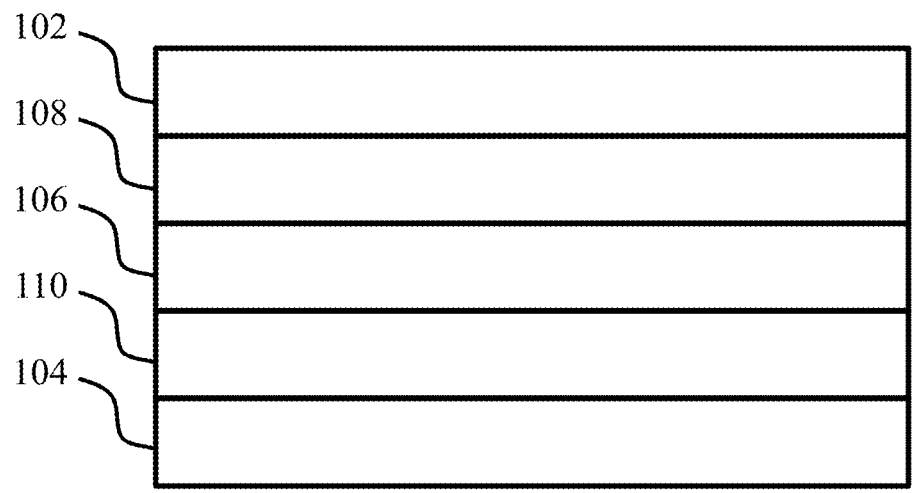
FIG. 1 shows a layer structure of an exemplary organic photovoltaic device.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electronvolts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC} * FF * J_{SC}}{P_O}$$

wherein $V_{OC}$ is the open circuit voltage, FF is the fill factor, $J_{SC}$ is the short circuit current, and $P_O$ is the input optical power.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVID. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Although certain embodiments of the disclosure are discussed in relation to one particular device or type of device (for example OPVs) it is understood that the disclosed improvements may be equally applied to other devices, including but not limited to OLEDs, PLEDs, charge-coupled devices (CCDs), photosensors, or the like.

Although exemplary embodiments described herein may be presented as methods for producing particular circuits or devices, for example OPVs, it is understood that the materials and structures described herein may have applications in devices other than OPVs. For example, other optoelectronic devices such as OLEDs and organic photodetectors may employ the materials and structures. More generally, organic devices, such as organic transistors, or other organic electronic circuits or components, may employ the materials and structures.

In some embodiments, the optoelectronic device has one or more characteristics selected from the group consisting of being flexible, being rollable, being foldable, being stretchable, and being curved. In some embodiments, the optoelectronic device is transparent or semi-transparent. In some embodiments, the optoelectronic device further comprises a layer comprising carbon nanotubes.

Organic Photovoltaic Cells

As disclosed herein, the various systems and methods disclosed herein may be provided within a single-junction solar cell or a tandem or multi junction solar cell.

FIG. 1 depicts an example of various layers of a single junction solar cell or organic photovoltaic cell (OPV) 100. The OPV cell may include two electrodes having an anode 102 and a cathode 104 in superposed relation, at least one donor composition, and at least one acceptor composition, wherein the donor-acceptor material or active layer 106 is positioned between the two electrodes 102, 104. In some embodiments, at least one intermediate layer 108 may be positioned between the anode 102 and the active layer 106. Additionally, or alternatively, at least one intermediate layer 110 may be positioned between the active layer 106 and cathode 104.

The anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyanaline (PANI), or 3,4-polyethyl-enedioxythiophene:polystyrenesulfonate (PEDOT:PSS).

The thickness of the anode 102 may be 0.1-100 nm, 1-10 nm, 0.1-10 nm, or 10-100 nm.

The cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-100 nm, 1-10 nm, 0.1-10 nm, or 10-100 nm.

As noted above, the OPV may include one or more intermediate layers, for example charge collecting/transporting intermediate layers positioned between an electrode 102, 104 and the active region or layer 106. The intermediate layer 108, 110 may be a metal oxide. In certain examples, the intermediate layer 108, 110 includes $MoO_3$, $V_2O_5$, ZnO, or $TiO_2$. In some examples, the first intermediate layer 108 has a similar composition as the second intermediate layer 110. In other examples, the first and second intermediate layers 108, 110 have different compositions.

The thickness of each intermediate layer may be 0.1-100 nm, 1-10 nm, 0.1-10 nm, or 10-100 nm.

The active region or layer 106 positioned between the electrodes 102, 104 includes a composition or molecule having an acceptor and a donor. In some embodiments, the composition may be arranged as an acceptor-donor-acceptor (A-D-A).

Figure 2:
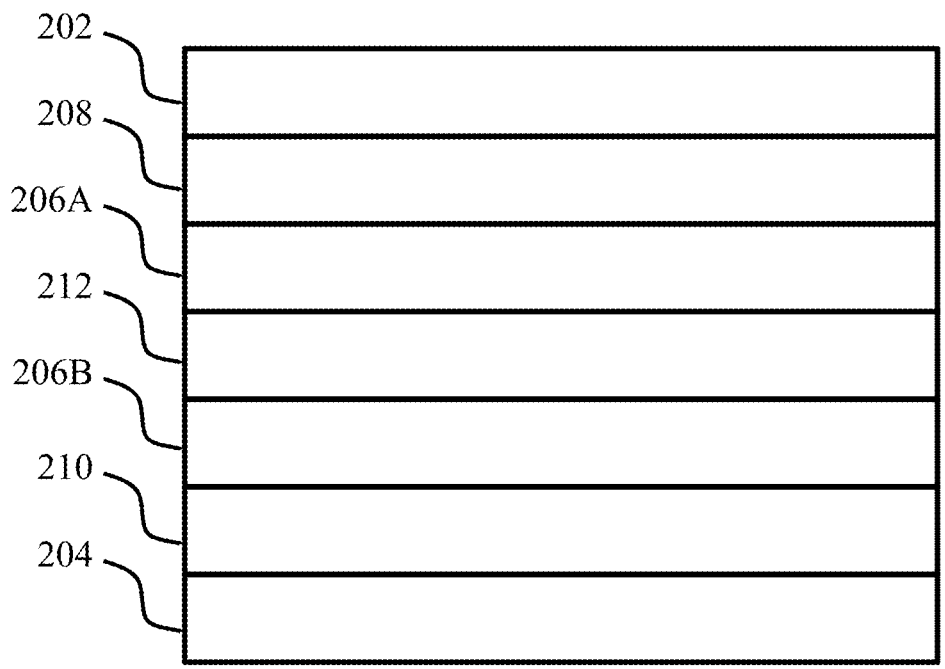
FIG. 2 shows a layer structure of an exemplary organic photovoltaic device.

FIG. 2 depicts an example of various layers of a tandem or multi junction solar cell or organic photovoltaic cell (OPV) 200. The OPV cell may include two electrodes having an anode 202 and a cathode 204 in superposed relation, at least one donor composition, and at least one acceptor composition positioned within a plurality of active layers or regions 206A, 206B between the two electrodes 202, 204. While only two active layers or regions 206A, 206B are depicted in FIG. 2, additional active layers or regions are also possible.

At least one intermediate layer 208 may be positioned between the anode 202 and a first active layer 206A. Additionally, or alternatively, at least one intermediate layer 210 may be positioned between the second active layer 206B and cathode 204.

At least one intermediate layer 212 may be positioned between the first active layer 206A and the second active layer 206B.

The compositions, thicknesses, etc. of each layer may be the same as those discussed with reference to FIG. 1.

The active region or layer 106, 206A, 206B positioned between the electrodes includes a composition or molecule having an acceptor and a donor. The composition may be arranged as an acceptor-donor-acceptor (A-D-A).

Disclosed herein are methods and systems for peel-off patterning of layered devices, in some embodiments organic optoelectronic devices. Some embodiments of the disclosed methods allow for patterning large-scale optoelectronic device modules with a geometric fill factor (GFF) of greater than 90%, greater than 95%, greater than 97%, or greater than 99%. In some embodiments, patterned devices may allow for micron-scale interconnection distance.

In one embodiment, disclosed herein is a multilevel peel-off patterning scheme for large scale features with micron-scale resolution. The disclosed method is damage-free to chemically sensitive materials and thus introduces minimal performance loss from fabrication. The method may be used to fabricate prototype opaque and semitransparent OPV modules with GFF=95.8%. In an experimental example presented below, a fabricated mini-module comprises eight, series connected 4 cm×0.4 cm cells separated by 200 μm wide interconnections. A schematic illustration of an exemplary module is shown in FIG. 12B. The opaque OPV module reaches PCE=10.3±0.3% under simulated AM 1.5 G illumination at 1 sun intensity, which is only 5% less than an analogous 4 mm² device. Combined with an ultrathin Ag top electrode and a visible light out-coupling (OC) structure, the ST-OPV module exhibits LUE=3.1±0.1% with PCE=7.3±0.2% and APT=41.8±1.4%.

In one embodiment, a module fabricated with the disclosed process has a blue-green tint with International Commission on Illumination (CIE) LAB coordinates of (L*, a*, b*)=(70.9, −11.3, −7.5). In addition, a color-neutral ST-OPV module is disclosed having LUE=1.7±0.1% and (L*, a*, b*)=(53.7, −1.9, −3.9). The disclosed method provides a unique integration scheme of multilevel, large scale patterning of chemically sensitive materials with photolithographic resolution.

Figure 3:
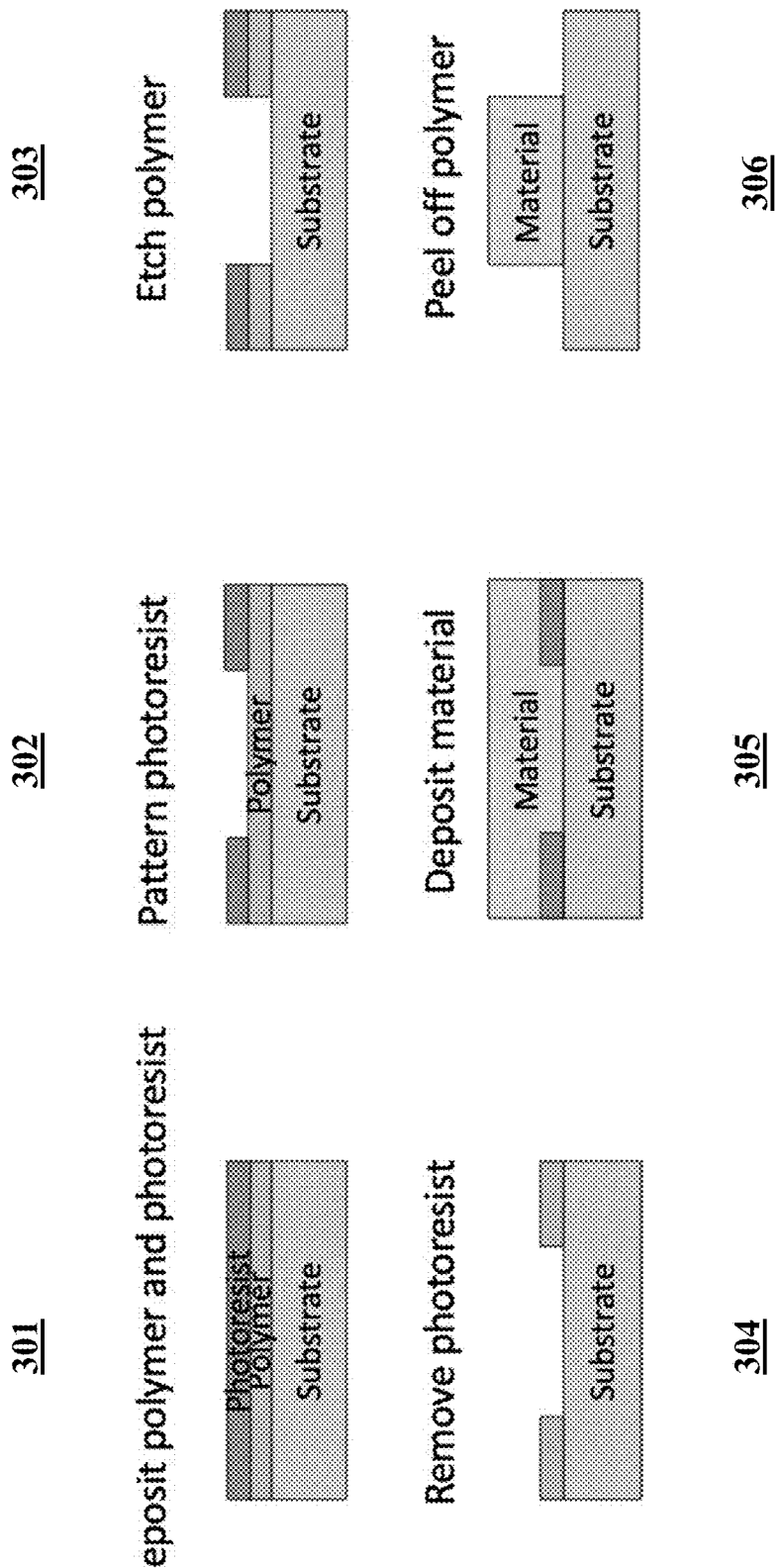
FIG. 3 shows a process diagram for a peel-off patterning method.

One method for peel-off patterning is shown in FIG. 3. In step 301, polymer (e.g., polyimide, parylene, etc.) and photoresist layers are coated on the substrate. Conventional photolithography steps are then used to pattern the photoresist layer in step 302. After etching the excess polymer (step 303), the remained photoresist layer is removed (304). Using the remaining polymer as a mask, the material (e.g., organic) can be coated directly as shown in step 305. The polymer is then mechanically peeled off from the substrate, leaving the patterned material as shown in step 306. The process disclosed in FIG. 3 requires the polymer mask to be mechanically stable so that it remains unbroken during the peel-off process, and to have limited adhesion to the substrate which enables an easy peel-off. While the adhesion between substrate and polymer materials may vary, surfactant or release agent layers (including, but not limited to, Micro 90®) can be introduced between the substrate and polymer to reduce the adhesion, which can allow for additional materials to be used as the polymer peel-off layer.

Figure 4:
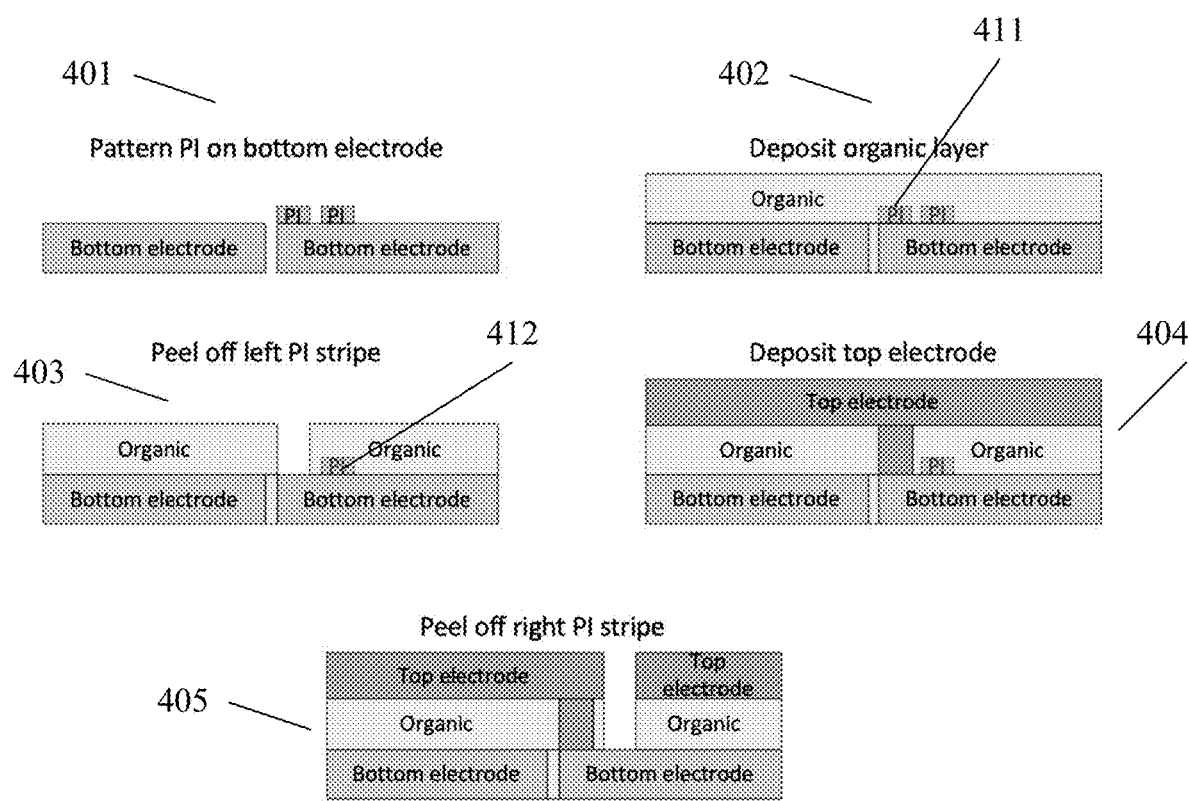
FIG. 4 shows a process diagram for creating a peel-off patterned series connection between devices.

Large scale optoelectronic device modules can be fabricated by connecting several unit devices together. One exemplary schematic flow of a fabrication method for series-connected devices is described in FIG. 4. The patterning layer (which may be a polymer patterning layer, comprising e.g., polyimide) is first coated and patterned into two thin stripes on the bottom electrode as shown in step 401. Although polyimide is used for the patterning layer in some embodiments, it is understood that any other suitable material may be used, including but not limited to parylene or polydimethylsiloxane (PDMS).

In some embodiments, a substrate or bottom electrode (or a patterning layer) may be treated with a surface treatment prior to the deposition or other positioning of the patterning layer on the substrate or bottom electrode. Suitable surface treatment materials include, but are not limited to Micro 90 or (3,3,3-trifluoropropyl) trichlorosilane. The surface treatment may in some embodiments be applied to the substrate or bottom electrode before the deposition of the polymer patterning layer, where possible deposition methods for surface treatment materials include, but are not limited to, vapor deposition or spin-coating. The surface treatment may in some embodiments serve to reduce the adhesion of the patterning layer to the substrate or bottom electrode, so that peeling the patterning layer from the substrate or bottom electrode is easier in subsequent steps. The surface treatment may in some embodiments allow for the use of patterning layer patterns having, for example, very long, thin features which may under normal circumstances break during peeling due to mechanical strain. In some embodiments, a feature of a patterning layer may have a width of less than 100 µm, less than 50 µm, less than 30 µm, less than 20 µm, less than 10 µm, less than 5 µm, less than 2 µm, less than 1 µm, less than 800 nm, less than 500 nm, less than 200 nm, or less than 100 nm. In some embodiments the feature of the patterning layer having the thin width may have a length of at least 1 mm, at least 5 mm, at least 10 mm, at least 20 mm, at least 30 mm, at least 40 mm, at least 50 mm, at least 100 mm, at least 200 mm, at least 500 mm, at least 700 mm, at least 1 m, at least 2 m, at least 3 m, or at least 5 m. The surface treatment and patterning material in combination may therefore allow for devices to be fabricated having a very high fill factor (in some embodiments greater than 99%) and also a very large surface area (for example on the order of square meters).

Figure 5B:
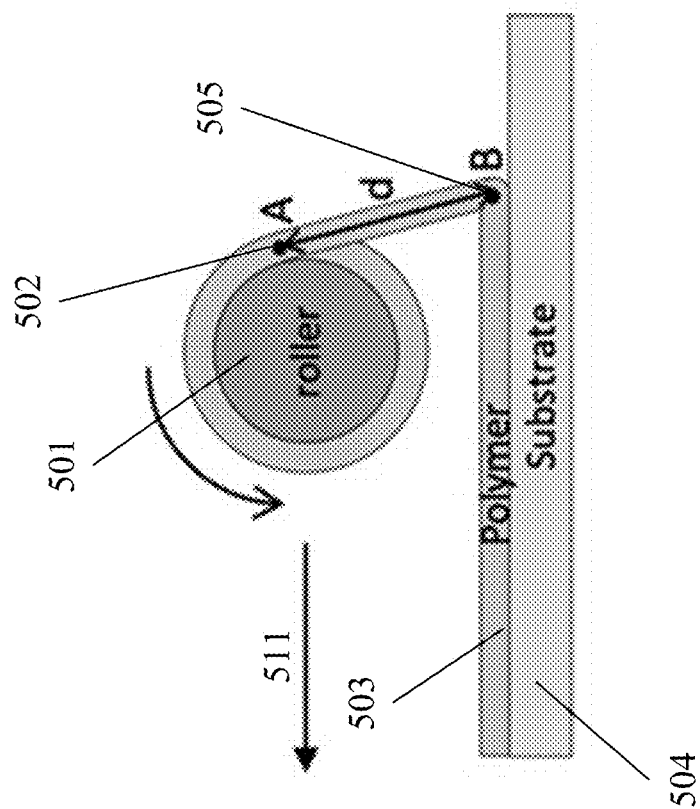
FIG. 5A and FIG. 5B show roller peel-off designs for long distance polymer stripe peel-off.
Figure 5A:
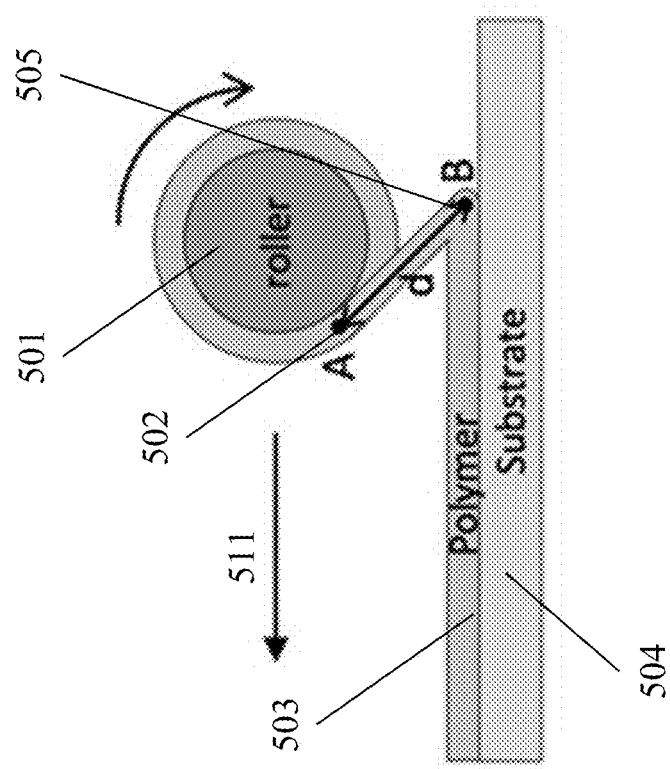

The device active layer (which may in some embodiments comprise one or more organic materials) is then coated onto the substrate in step 402. The left polymer stripe 411 is peeled off after the active layer coating to expose the bottom electrode for a series connection in step 403. The top electrode is coated on the active layer in step 404, and the right polymer stripe 412 is peeled off subsequently in step 405 to separate the top electrodes of two devices. In some embodiments, the peeling step is achieved using a roller, for example as shown in FIG. 5A and FIG. 5B.

With this process, the width of the finely patterned polymer stripes 411 and 412 can be small to produce sub-micrometer sized interconnection distance between unit devices, while the separation between the two stripes can also be patterned to sub-micrometer scales to define active layers with a very small area.

Figure 6:
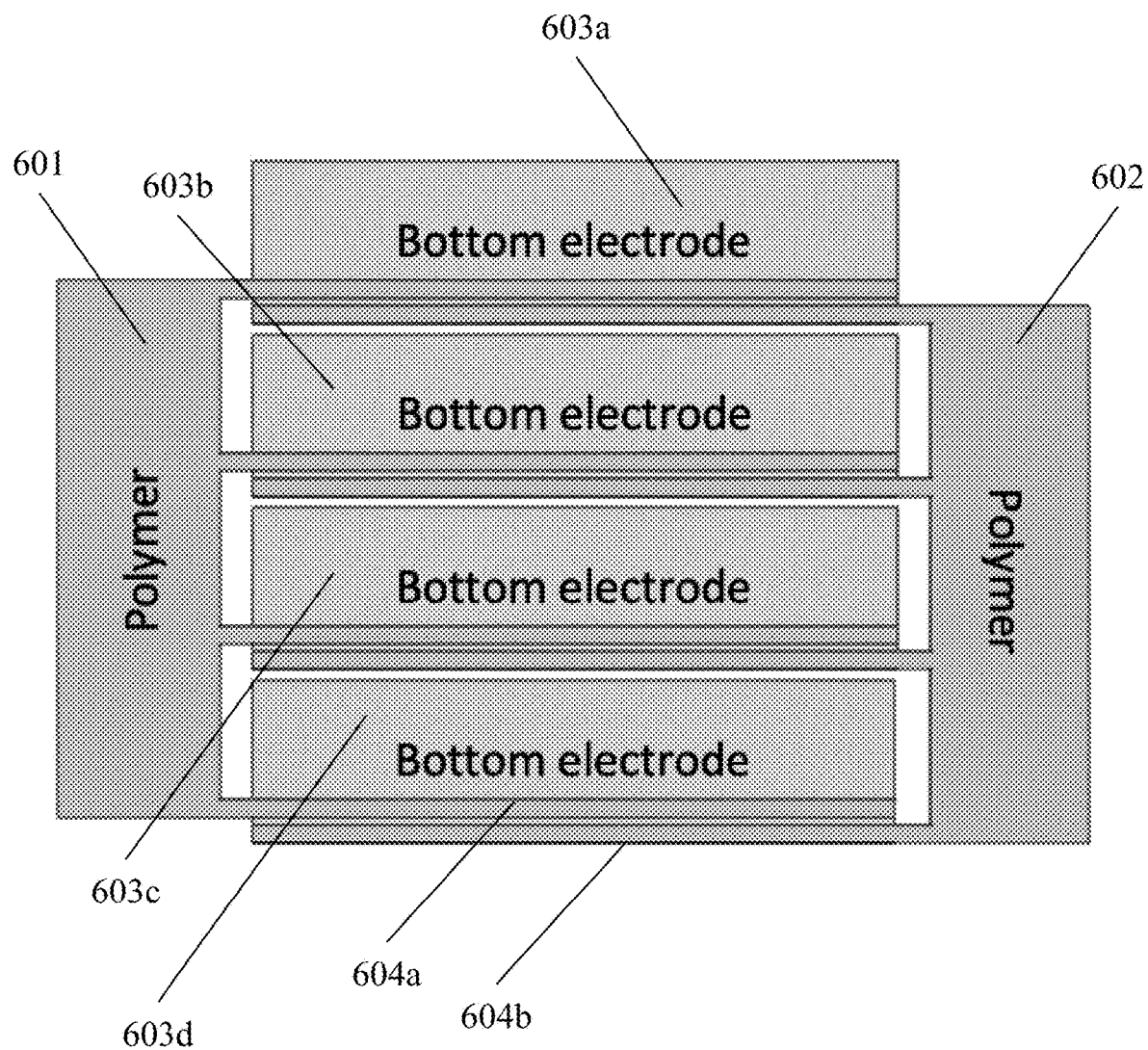
FIG. 6 shows a polymer pattern design to peel-off of several series-connections simultaneously.

The process can be better understood with reference to the top-down view shown in FIG. 6. With reference to FIG. 6, a patterning layer may be defined as one or more handles 601 each being connected to one or more thin strips (e.g. 604a and 604b) positioned between regions of bottom electrode material (e.g. 603a, 603b, 603c, 603d). In the embodiment depicted in FIG. 6, for example, the bottom electrodes 603a-603d may first be deposited, then a patterning layer, which in the depicted embodiment comprises a polymer but as understood herein may comprise any other suitable material, is deposited over the bottom electrodes and photolithographically etched into the shape shown in FIG. 6. After later layers, for example charge transport layers, heterojunction layers, top electrode layers, or any other layers suitable for use in an optoelectronic device. After one or more layers have been deposited, peeling off of all or part of the patterning layer (beginning from for example handles 601 or 602 may effectively pattern the overlying layers without the use of any harsh chemical or photolithographic processes, while still allowing for very fine feature formation. In some embodiments, after a first overlying layer, for example a heterojunction layer, is deposited over the bottom electrodes, the first portion of the patterning layer comprising handle 601 and strip 604a is removed, also removing corresponding strips of the overlying heterojunction layer. Later, a second overlying layer, for example a top electrode, is deposited over the heterojunction layer and the second portion of the patterning layer, and the second portion of the patterning layer including handle 602 and thin strip 604b is removed, also removing corresponding portions of the top electrode layer and any other intervening overlying layers.

Figure 7:
FIG. 7 is a schematic illustration of a peel-off patterning procedure.
Figure 7:
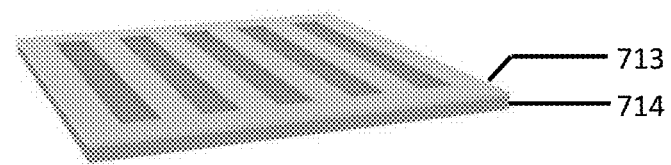
Figure 7:
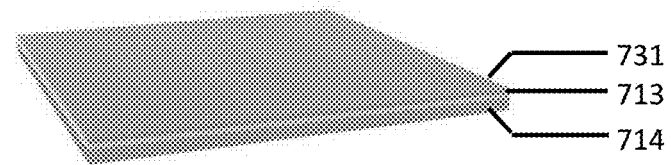
Figure 7:
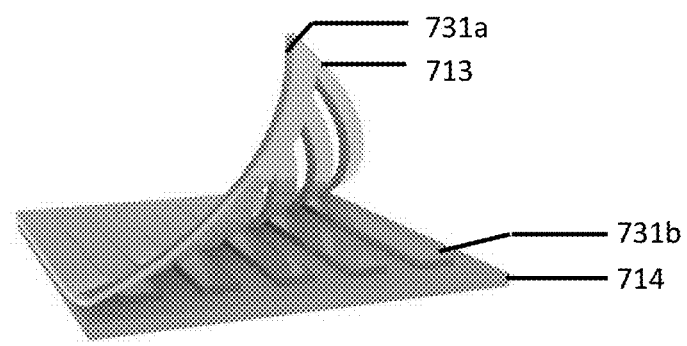
Figure 7:
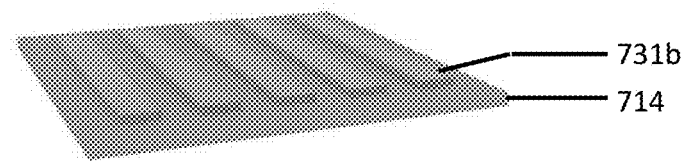

The peel off process is shown in another embodiment in FIG. 7. With reference to FIG. 7, in a first step 701, a polymer (e.g. polyimide) "patterning layer" 713 is first coated on the substrate 714 and patterned with conventional photolithography, using a photoresist material 712 and a photolithography mask 711. In step 702, the photoresist 712 is removed, leaving the patterned polymer 713. In step 703, the organic layer to be patterned 731 is deposited and the patterning layer 713 is then mechanically peeled off in step 704, leaving the patterned organic material 731b on the substrate 714 (as shown in step 705) and removing the excess organic material 731a. This method can achieve the same resolution as photolithography without exposing the organic layer to chemical solutions.

Figure 8:
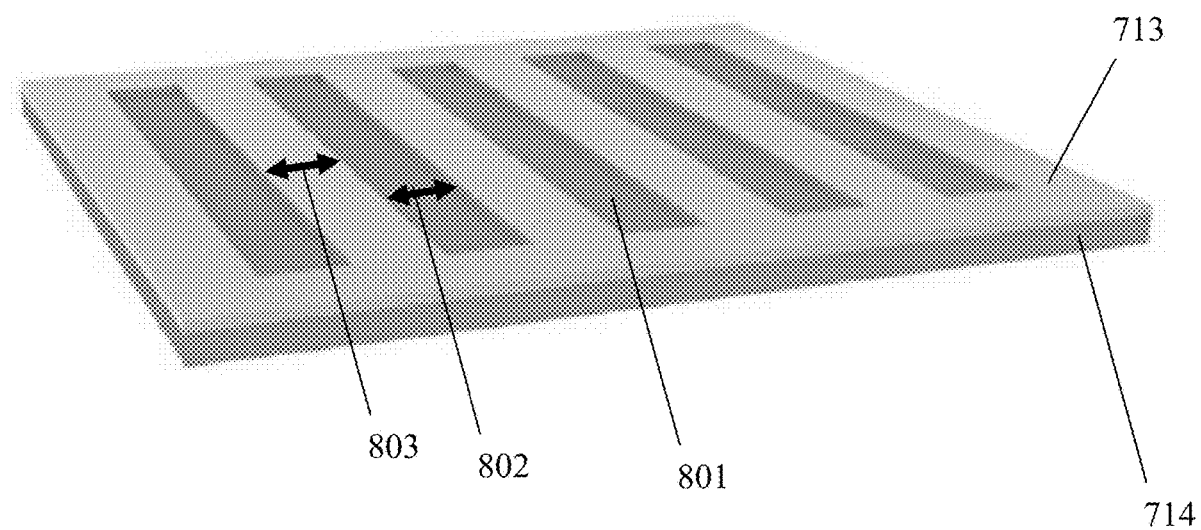
FIG. 8 is a detail view of one of the steps of FIG. 7.

A detail view of the patterning layer 713 and substrate 714 is shown in FIG. 8. With reference to the detail view, certain parameters of a patterning layer 713, which may be a polymer patterning layer, may be defined as the patterning layer itself, having a shape, and one or more voids 801 in the patterning layer. Such voids 801 are shown in FIG. 8 with a rectangular shape, however because the voids are formed using photolithography in some embodiments, it is understood that the voids can have any shape, including but not limited to square, triangular, rectangular, ovoid, circular, polygonal, or arbitrary. In some embodiments, a patterning layer 713 may have one or more parameters defined by parameters of the layer itself or parameters of the voids 801 in the layer, for example a width 802 of a region of the patterning layer between two voids, or a width 803 of one or more voids. In some embodiments, the width 802 of a region of a patterning layer may be in a range of 1 µm to 10 mm, or 10 µm to 5 mm, or 10 µm to 1 mm, or 20 µm to 500 µm, or 50 µm to 200 µm, or about 100 µm or about 50 µm or about 20 µm or about 10 µm. In some embodiments, the width 803 of a void of a patterning layer may be in a range of 1 µm to 10 mm, or 10 µm to 5 mm, or 10 µm to 1 mm, or 20 µm to 500 µm, or 50 µm to 200 µm, or about 100 µm or about 50 µm or about 20 µm or about 10 µm.

Figure 12A:
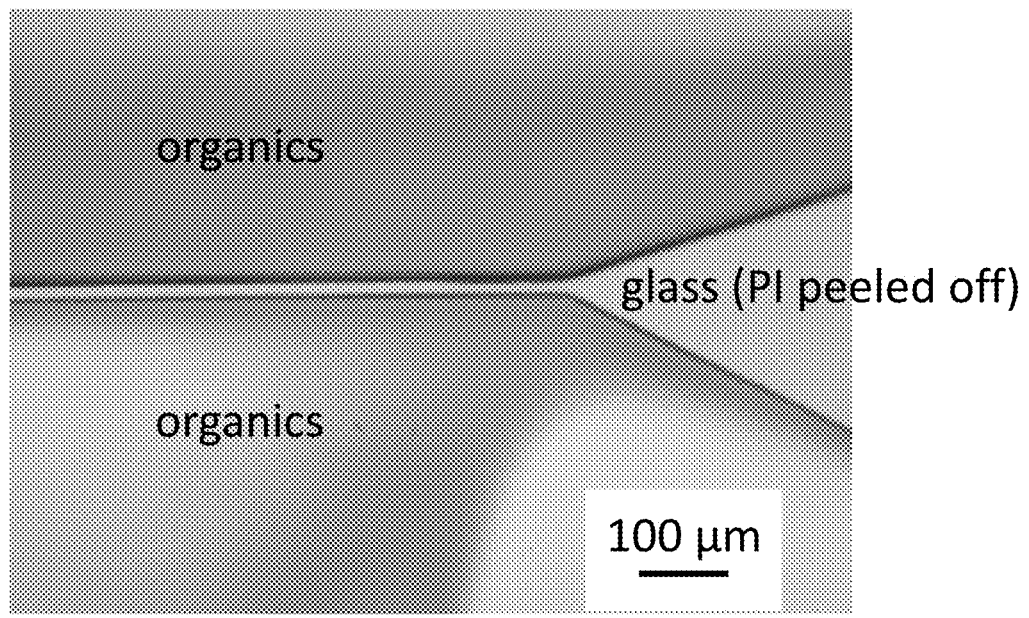
FIG. 12A is a microscopic image of a PCE-10:BT-CIC blend film on a glass substrate patterned by peeling off a 10 μm wide polyimide (PI) strip.
Figure 12B:
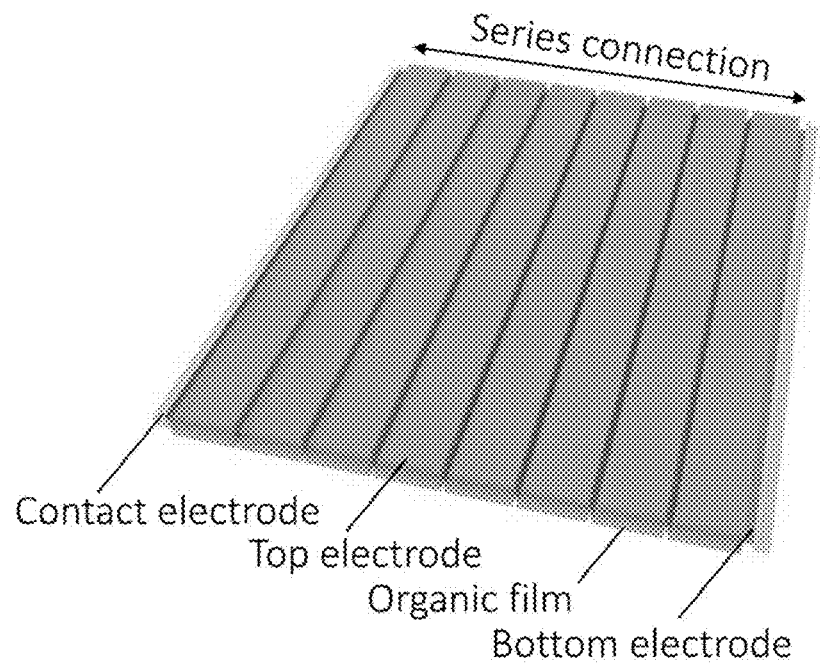
FIG. 12B is a schematic of a series connected prototype organic photovoltaic module layout comprising eight individual cells.

FIG. 12A shows a microscopic image of the organic blend film on a glass substrate patterned by peeling off a 10 µm wide polyimide (PI) stripe. The wedge at the edge of the PI stripe is in some embodiments picked up to initiate the peel-off. Similar methods may be employed in the patterning of biological materials, organics, and perovskites. In some embodiments, the patterning of micrometer scale features is achieved with a single level patterning step utilizing one polymer layer to pattern one target layer. To achieve complicated device structures and circuit interconnections in a module, however, multi-step/multilevel large-scale peel-off patterning is needed.

In other existing embodiments that employ multi-step peel-off patterning, multiple polymer layers are sequentially deposited and lithographically patterned over chemically sensitive materials. This method has a disadvantage in that it severely degrades device performance.

A possible way to scale up and pattern multiple series-connected devices simultaneously is to connect multiple polymer stripes at a point outside the device area as shown in FIG. 6, in which stripes can be simultaneously peeled off. For example, after a device active layer deposition on the bottom electrode, the wide polymer bar 602 as well as all the stripes connected to it (including stripe 604b) are peeled off. Then, the same peel-off process can be applied to the polymer bar 601 after top electrode deposition to remove the stripes connected to it, including stripe 604a.

For fabrication of larger modules, for example at the meter scale, it is critical to peel off the ultrafine polymer stripes over meter- or several-meter-long distances without breaking them. FIG. 5A and FIG. 5B illustrate a roller peel-off design to realize long distance peel-off. As part of the polymer stripes 503 are peeled off, they wrap onto the roller 501, which maintains a reasonable small distance (d) between the point 502 where the peeling force is applied and the point 505 connected to the substrate 504. The method therefore significantly reduces the possibility of breaking over long distance. FIG. 5A and FIG. 5B show two exemplary methods of rolling, one (shown in FIG. 5A) where the roller moves in a clockwise direction, pulling the polymer layer 503 onto the roller from the leading edge of the roller 501 as it moves in the direction of travel 511, and the other (shown in FIG. 5B) where the roller moves in a counter-clockwise direction, pulling the polymer layer 503 onto the roller from the trailing edge of the roller 501 as it moves in the direction of travel 511.

Combination with Other Materials

The materials described herein as useful for a particular layer in an organic optoelectronic device may be used in combination with a wide variety of other materials present in the device. The materials described or referred to below are non-limiting examples of materials that may be useful in combination with the compounds disclosed herein, and one of skill in the art can readily consult the literature to identify other materials that may be useful in combination.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

Experiment #1

Figure 9:
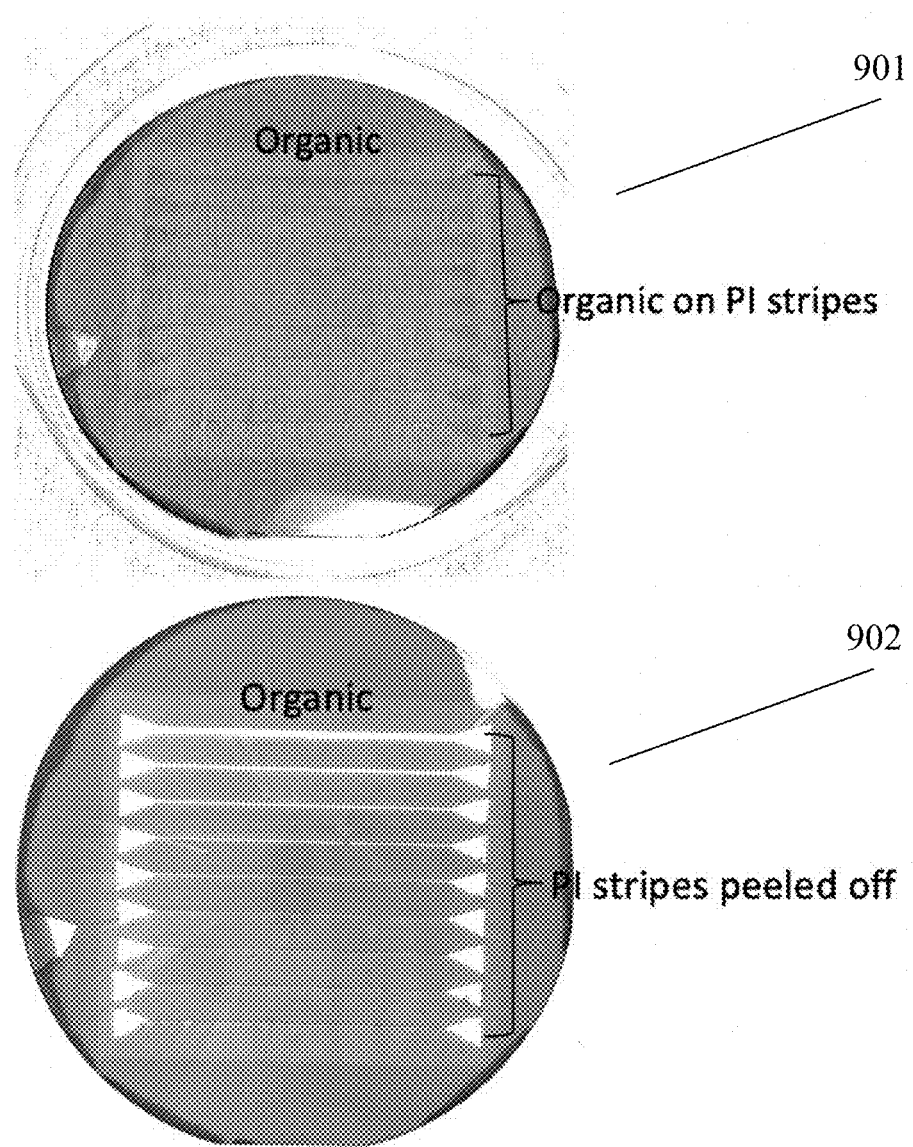
FIG. 9 shows photographs of an organic blend film coated on patterned polyimide, before and after peel-off.
Figure 10:
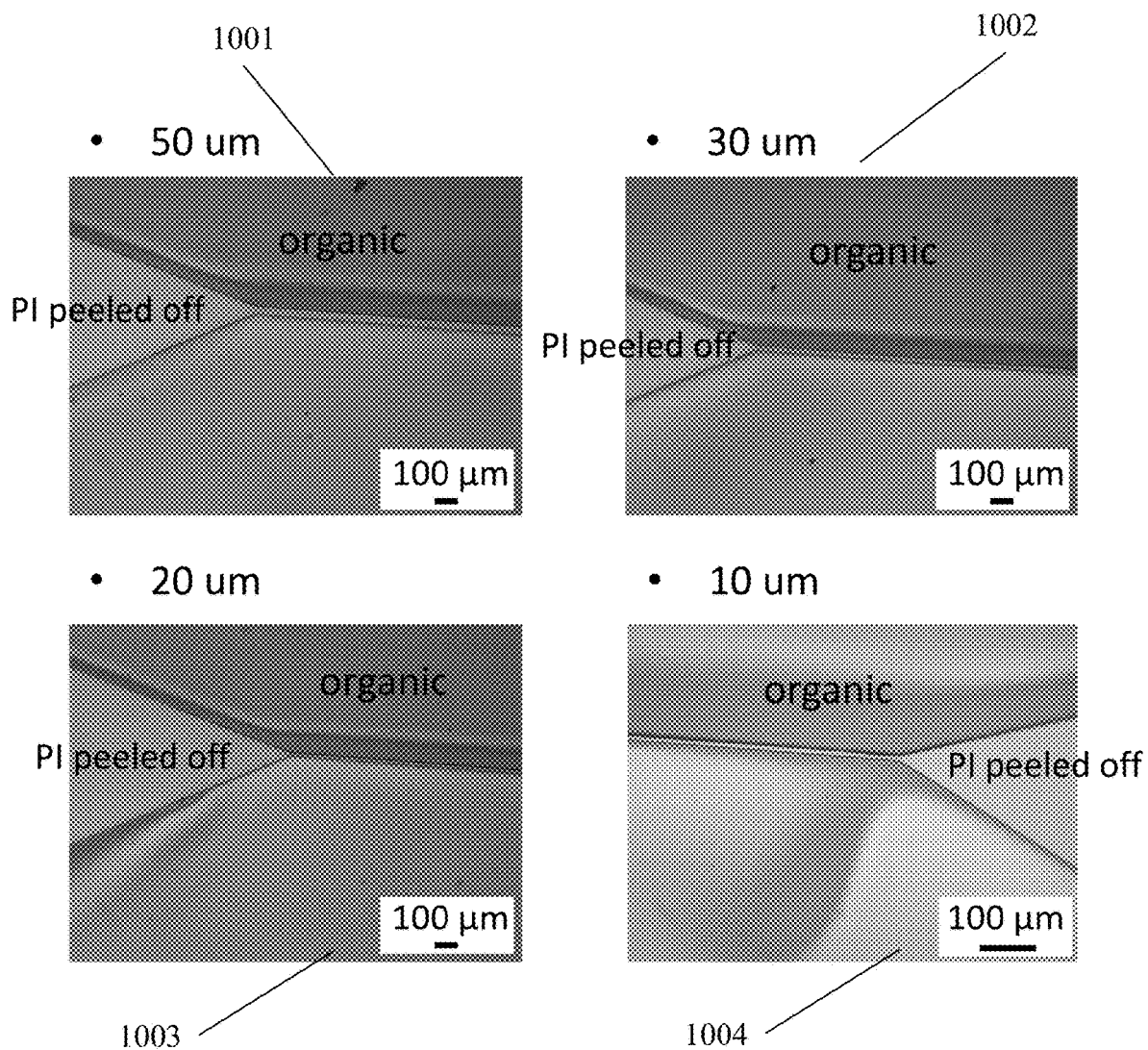
FIG. 10 shows microscopic images of peel-off results.

To demonstrate the feasibility of peeling off thin polymer stripes over long distance, an organic blend film was spin-coated on patterned polyimide (PI) stripes whose widths ranged from 1 mm to 10 µm. Eight stripes were used having widths of 1 mm, 500 µm, 300 µm, 200 µm 100 µm, 50 µm, 30 µm, 20 µm, and 10 µm. FIG. 9 shows the photos before (901) and after (902) peeling off the PI stripes. The peel-off of 1 mm, 500 µm, 300 µm, 200 µm and 100 µm PI stripes show clean edge on the photos. FIG. 10 shows microscopic images of the edges after peeling off 50 µm (1001), 30 µm (1002), 20 µm (1003) and 10 µm (1004) PI stripes. As shown in the pictures, a PI stripe as thin as 10 µm can be successfully peeled off after organic material deposition and leaves a clean edge. As shown in the figure, the image 1004 is further magnified in comparison to the images 1001-1003.

Experiment #2

Figure 11A:
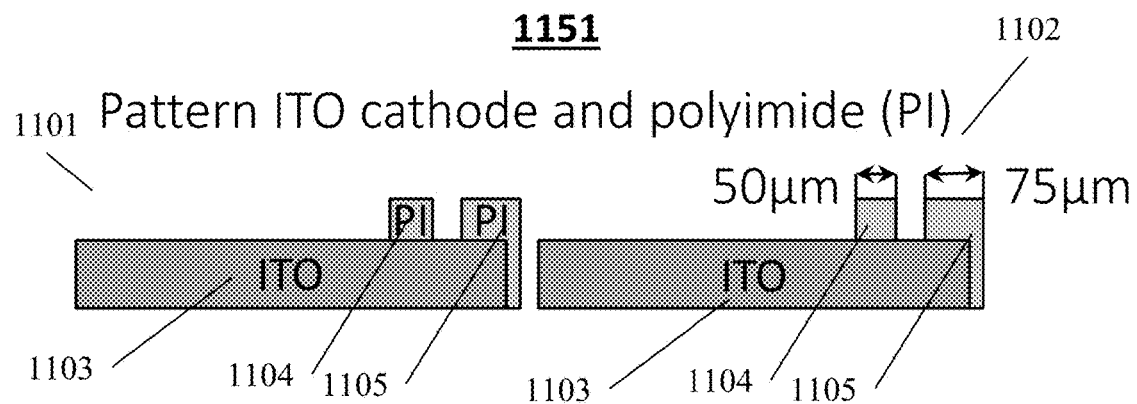
FIG. 11A and FIG. 11B show a schematic illustration of the fabrication steps to create series cell connection via peel-off patterning, and a microscopic image of an interconnection region between two individual semitransparent organic photovoltaic (ST-OPV) cells in a module is shown in FIG. 11B.
Figure 11A:
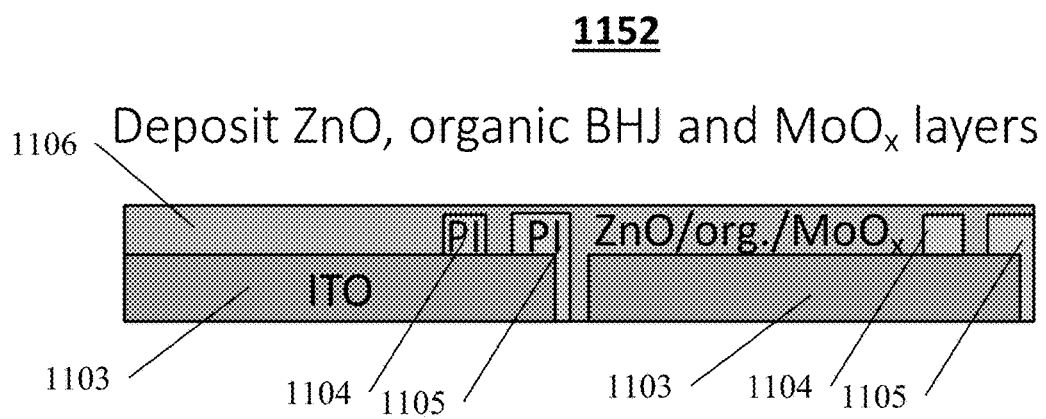
Figure 11A:
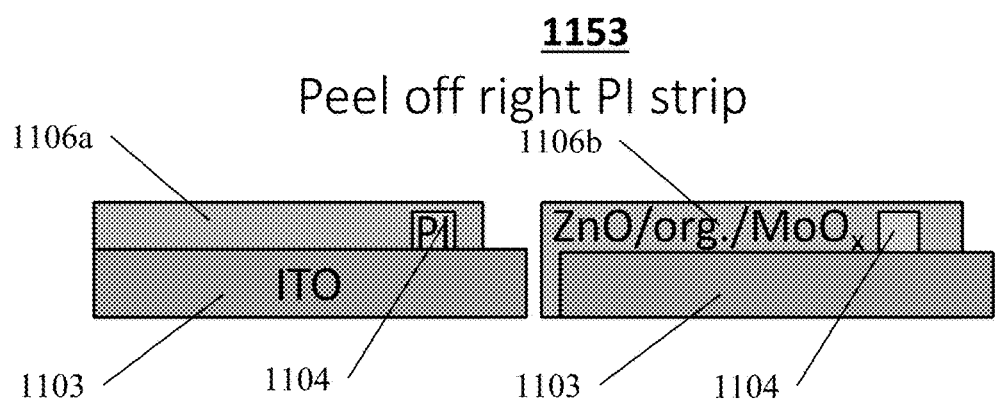
Figure 11B:
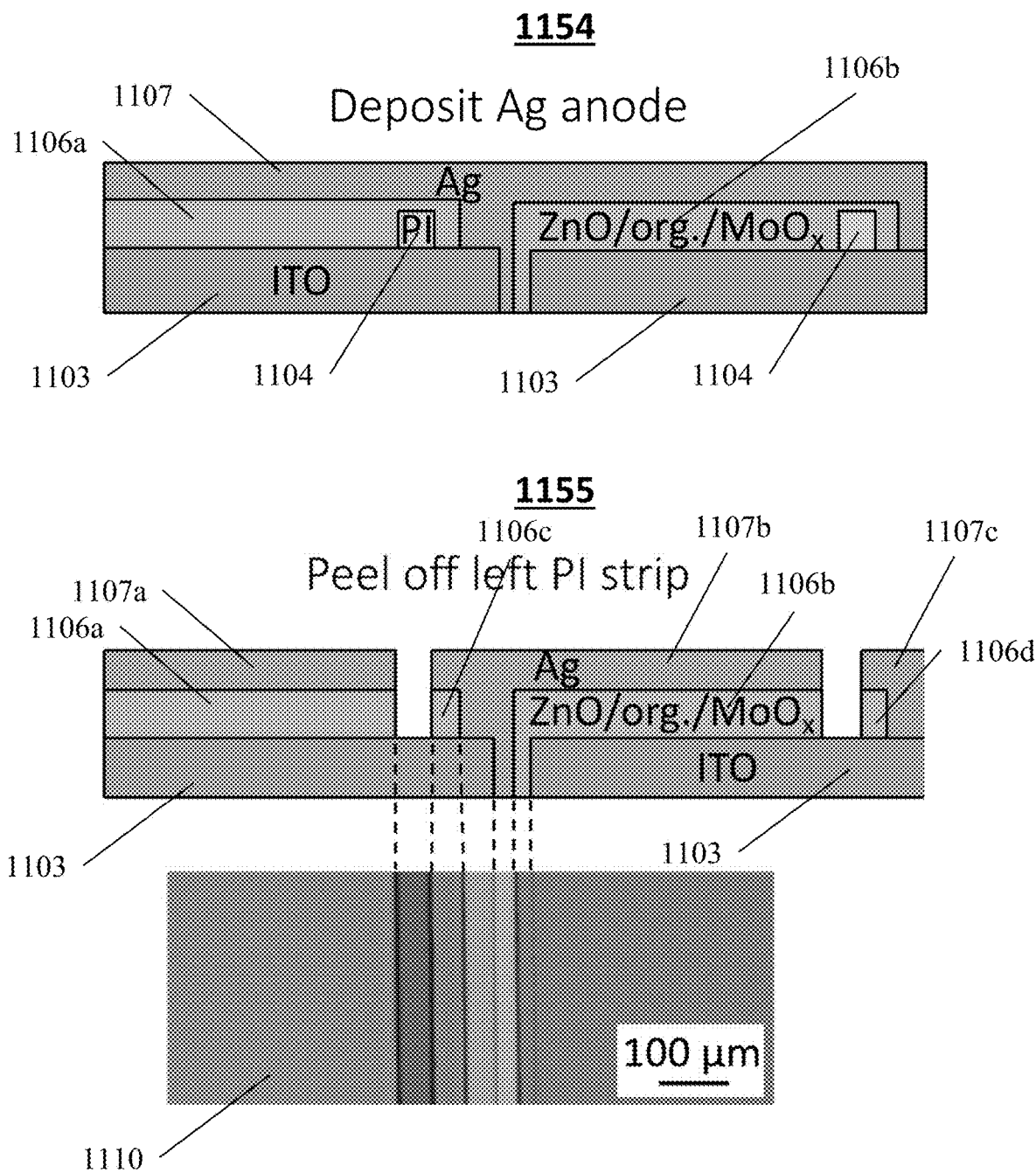

FIG. 11A and FIG. 11B illustrate a multilevel patterning procedure to realize series connections between individual OPV cells. With reference to FIG. 11A, in step 1151, The indium tin oxide (ITO) bottom cathode 1103 is photolithographically patterned into 4.15 mm wide strips, and a PI patterning layer is coated onto the electrodes. The PI is then patterned into 50 µm and 75 µm wide strips (1104, 1105, respectively) via photolithography. As shown in FIG. 11A, each ITO cathode 1103 has a corresponding set of 50 µm and 75 µm PI strips with a 50 µm separation between the two.

Next, in step 1152, the ZnO and MoO$_x$ charge transport layers as well as the ternary bulk heterojunction (BHJ), comprising a blend of the narrow energy gap polymer donor PCE-10 and two NIR-absorbing acceptors BT-CIC and TT-FIC (1106), are deposited. The 75 µm wide strips 1105 between two adjacent bottom cathodes are peeled off to separate the charge transport layers and BHJ of adjacent devices, and to expose part of the bottom electrodes 1103, as shown in step 1153. Finally, the Ag anode 1107 is deposited (see 1154), and the remaining 50 µm wide polymer strips 1104 are subsequently peeled off to separate the top electrodes 1107a and 1107b of two adjacent devices, as shown in step 1155. The microscopic image 1110 is an image of the 200 µm wide interconnection between two individual OPV cells, showing clean edges to the pattern.

The length of each individual cell in the module is 4 cm, and the width is limited to 4 mm to reduce the series resistance loss from transparent electrodes. The modules have 12.8 cm$^2$ active area for a total module area of 13.34 cm$^2$, and GFF=95.8%. The GFF can be further improved by patterning narrower polymer strips. For example, for 10 µm wide PI strips as demonstrated in FIG. 12A, the interconnection distance can be reduced to 40 µm, giving GFF=99.1%.

Figure 12C:
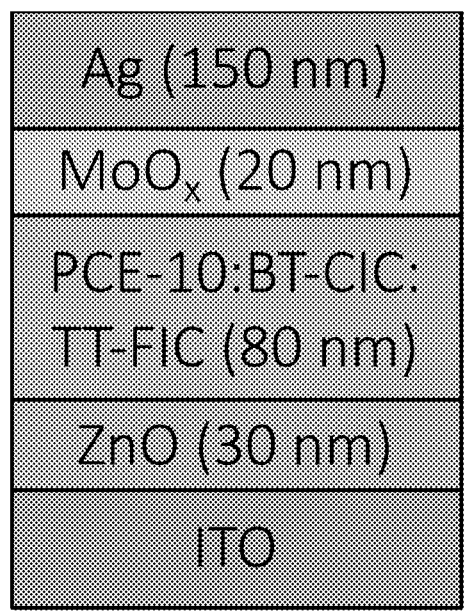
FIG. 12C is a schematic diagram of an exemplary device structure.
Figure 12D:
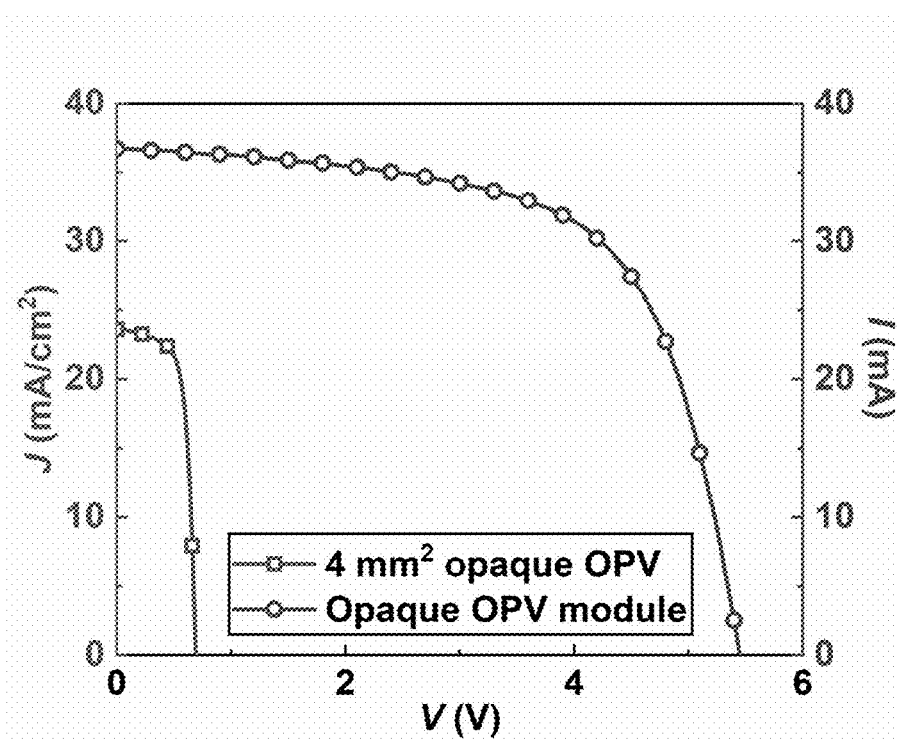
FIG. 12D and FIG. 12E are graphs of performance data of the device of FIG. 12C.
Figure 12E:
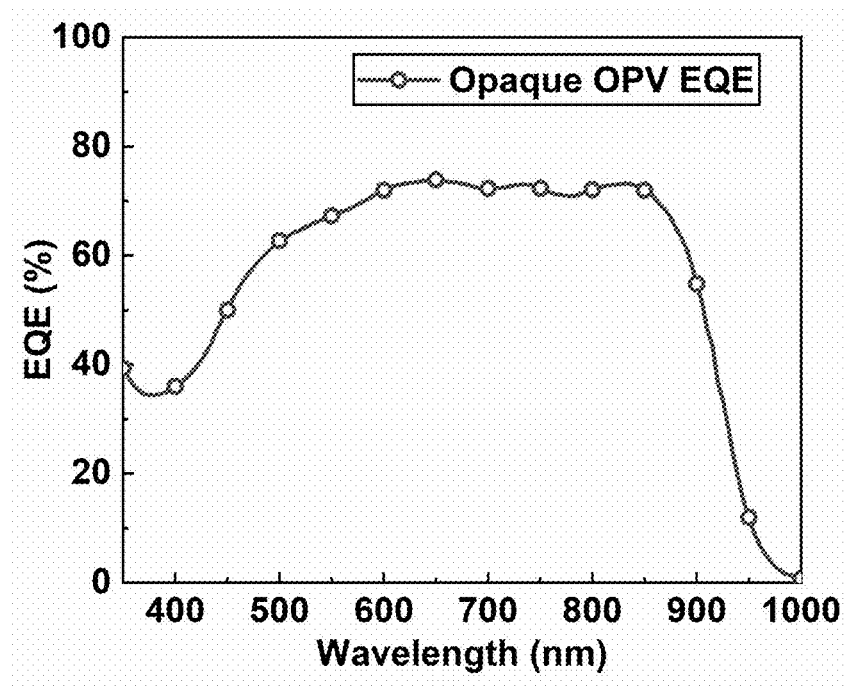

To study the feasibility of the patterning method, an opaque OPV module was fabricated, as well as an analogous 4 mm$^2$ device comprising a 150 nm indium tin oxide (ITO) bottom cathode, an 80 nm thick PCE-10:BT-CIC:TT-FIC (1:1.25:0.5, w/w/w) blended ternary BHJ, 30 nm thick ZnO and 20 nm thick MoO$_x$ as electron and hole transporting layers, respectively, and a 150 nm Ag anode, their performance parameters are listed in Table 1 below (see FIG. 12C for the device structure and FIG. 12D and FIG. 12E for performance data). The module achieves short circuit current $I_{SC}$=36.7±0.6 mA, open circuit voltage $V_{OC}$=5.42±0.02 V, fill factor FF=0.66±0.01, and PCE=10.3±0.3%. Compared to the 4 mm$^2$ device, the module shows negligible loss in $I_{SC}$ (individual cell area 1.6 cm$^2$, with an average short circuit current density of $J_{SC\_AVG}$=22.9 mA/cm$^2$) and $V_{OC}$, while the FF decreases from 0.69±0.01 to 0.66±0.01, which is primarily due to resistance losses from the ITO cathode. With 4% decrease in FF, the module PCE shows only a 5% decrease compared to the 4 mm$^2$ device.

Table 1 shows the performance of a 4 mm$^2$ PCE-10:BT-CIC:TT-FIC OPV device, and 12.8 cm$^2$ active area (13.34 cm$^2$ total area) module under simulated AM 1.5 G illumination at 1 sun intensity. The module PCE is calculated based on the module active area.

Figure 13:
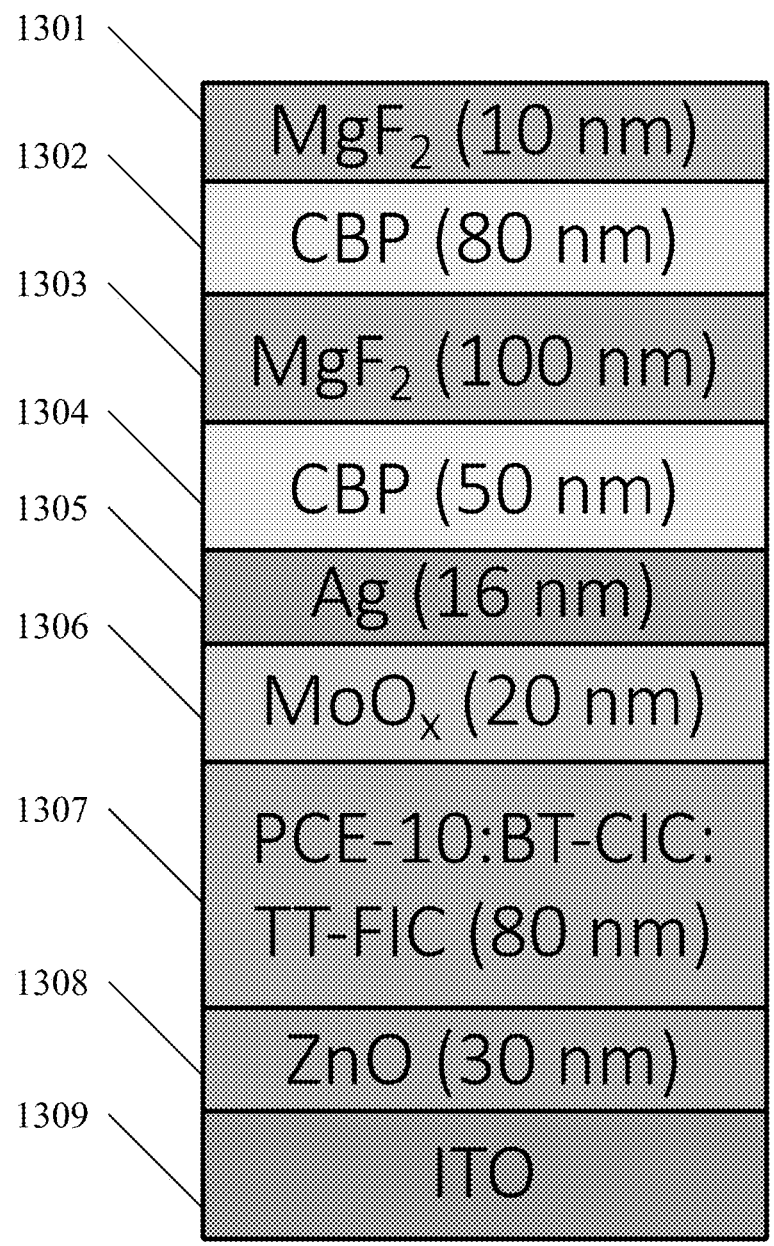
FIG. 13 shows a schematic of an ST-OPV device with an optical out-coupling (OC) structure.
Figure 14A:
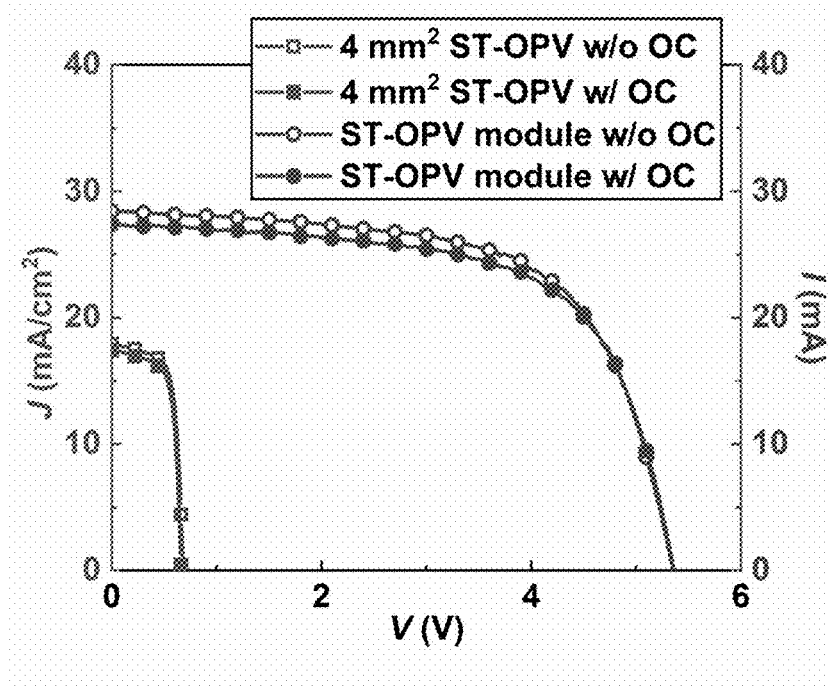
FIG. 14A is a graph of current density-voltage (J-V) and current-voltage (I-V) characteristics of 4 mm$^2$ ST-OPV devices and modules with and without the OC structure.
Figure 14B:
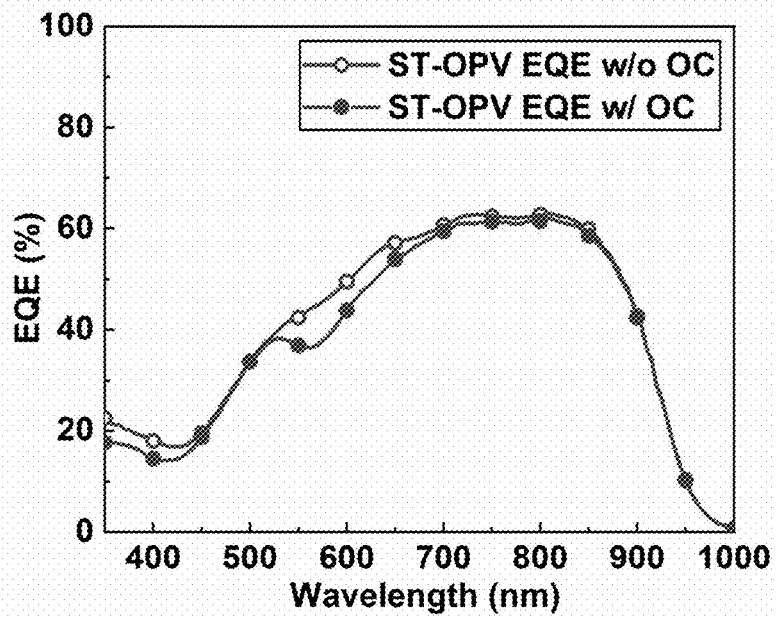
FIG. 14B is a graph of External quantum efficiency (EQE) of the ST-OPV with and without OC structure.

With reference to FIG. 13, the ST-OPVs were fabricated by substituting the thick Ag anode with an ultrathin 16 nm Ag layer 1305, and integrating a 4-layer outcoupling structure comprising CBP (50 nm) (1304)/MgF$_2$ (100 nm) (1303)/CBP (80 nm) (1302)/MgF$_2$ (10 nm) (1301). FIG. 14A shows the current density-voltage (J-V) and current-voltage (I-V) characteristics of the 4 mm$^2$ ST-OPV devices and modules with and without the OC structure. The external quantum efficiency (EQE), transmission, and reflection spectra of the devices are plotted in FIG. 14B and FIG. 14C, with detailed performance parameters provided in Table 1 above.

Figure 14C:
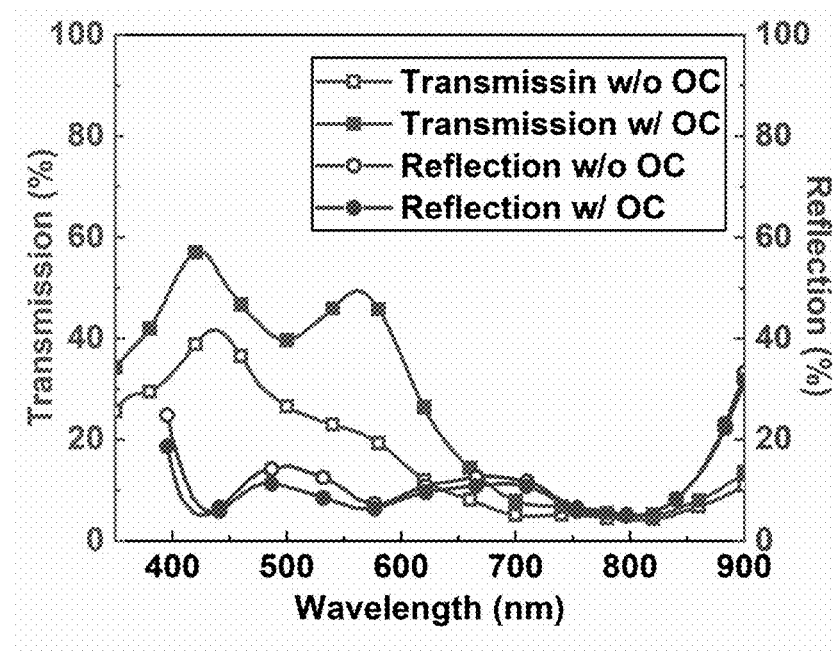
FIG. 14C is a graph of transmission and reflection spectra of the ST-OPV with and without OC structure.

The ST-OPV modules show negligible loss in $I_{SC}$ and $V_{OC}$ compared to the analogous 4 mm$^2$ device. The ultrathin Ag top anode 1305 introduces additional resistance loss due to its limited conductivity. This results in a reduction in FF from 0.70±0.01 to 0.64±0.01. The OC structure maximizes the transmission of visible wavelengths via control of interference peaks in the multilayer stacks. FIG. 14C shows that the transmission of an ST-OPV device without the OC structure has a peak at a wavelength of l=430 nm, followed by a significant decrease at l>500 nm due to the absorption by the BHJ. To improve the APT, the OC structure enhances the transmission between 400 nm and 600 nm, with a peak at 560 nm, which is close to the peak of the photopic response of the human eye. Therefore, the OC structure significantly improves the APT from 22.3±1.1% to 41.8±1.4%. Also, the OC structure slightly reduces $I_{SC}$ of the module from 28.2±0.7 mA to 27.2±0.5 mA due to reduced absorption in the organic BHJ, which is also apparent from the decreased EQE in FIG. 14B. The ST-OPV module with the OC structure exhibits PCE=7.3±0.2% and reaches LUE=3.1±0.1%.

Figure 14D:
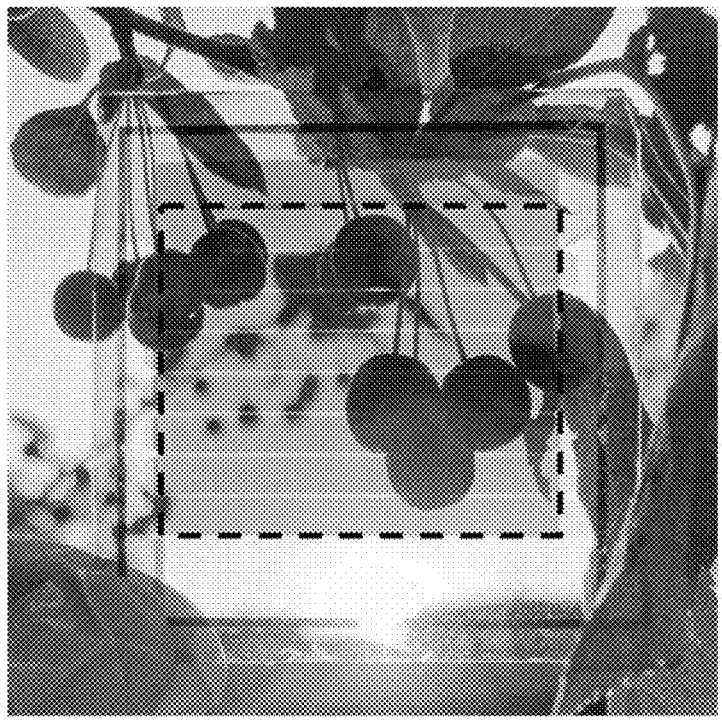
FIG. 14D is a photographic image of the prototype ST-OPV module with the OC structure.

A photographic image of the module with OC structure is shown in FIG. 14D. The module area (outline with a black dashed box) shows high transmission and narrow, bright lines from transmission through the gaps in the interconnection regions. This effect can be reduced, either by increasing the APT to reduce the contrast between the active and interconnection areas, or by patterning narrower stripes. Ideally, modules used as window panels should transmit light as close to neutral color as possible, which requires (a*, b*) coordinates in the CIELAB color space that approach (0,

TABLE 1

| 4 mm$^2$ device | $J_{SC}$ (mA/cm$^2$) | $V_{OC}$ (V) | FF (%) | PCE (%) | APT (%) | LUE (%) |
|---|---|---|---|---|---|---|
| opaque | 23.2 ± 0.4 | 0.68 ± 0.01 | 0.69 ± 0.01 | 10.9 ± 0.3 | — | — |
| ST w/o OC | 17.8 ± 0.3 | 0.67 ± 0.01 | 0.70 ± 0.01 | 8.3 ± 0.2 | 22.3 ± 1.1 | 1.9 ± 0.1 |
| ST w/OC | 17.1 ± 0.2 | 0.67 ± 0.01 | 0.70 ± 0.01 | 8.0 ± 0.2 | 41.8 ± 1.4 | 3.3 ± 0.1 |
| neutral ST | 17.4 ± 0.3 | 0.67 ± 0.01 | 0.70 ± 0.01 | 8.2 ± 0.1 | 22.8 ± 1.3 | 1.9 ± 0.1 |

| module | $I_{SC}$ (mA) | | | PCE$_{active}$ (%) | | |
|---|---|---|---|---|---|---|
| opaque | 36.7 ± 0.6 | 5.42 ± 0.02 | 0.66 ± 0.01 | 10.3 ± 0.3 | — | — |
| ST w/o OC | 28.2 ± 0.7 | 5.34 ± 0.02 | 0.64 ± 0.01 | 7.5 ± 0.3 | 22.3 ± 1.1 | 1.7 ± 0.1 |
| ST w/OC | 27.2 ± 0.5 | 5.34 ± 0.02 | 0.64 ± 0.01 | 7.3 ± 0.2 | 41.8 ± 1.4 | 3.1 ± 0.1 |
| neutral ST | 27.4 ± 0.4 | 5.34 ± 0.02 | 0.64 ± 0.01 | 7.4 ± 0.2 | 22.8 ± 1.3 | 1.7 ± 0.1 |

0). The ST-OPV module with OC exhibits CIELAB coordinates (L*, a*, b*)=(70.9, −11.3, −7.5), which accounts for its blue-green tint.

Figure 15:
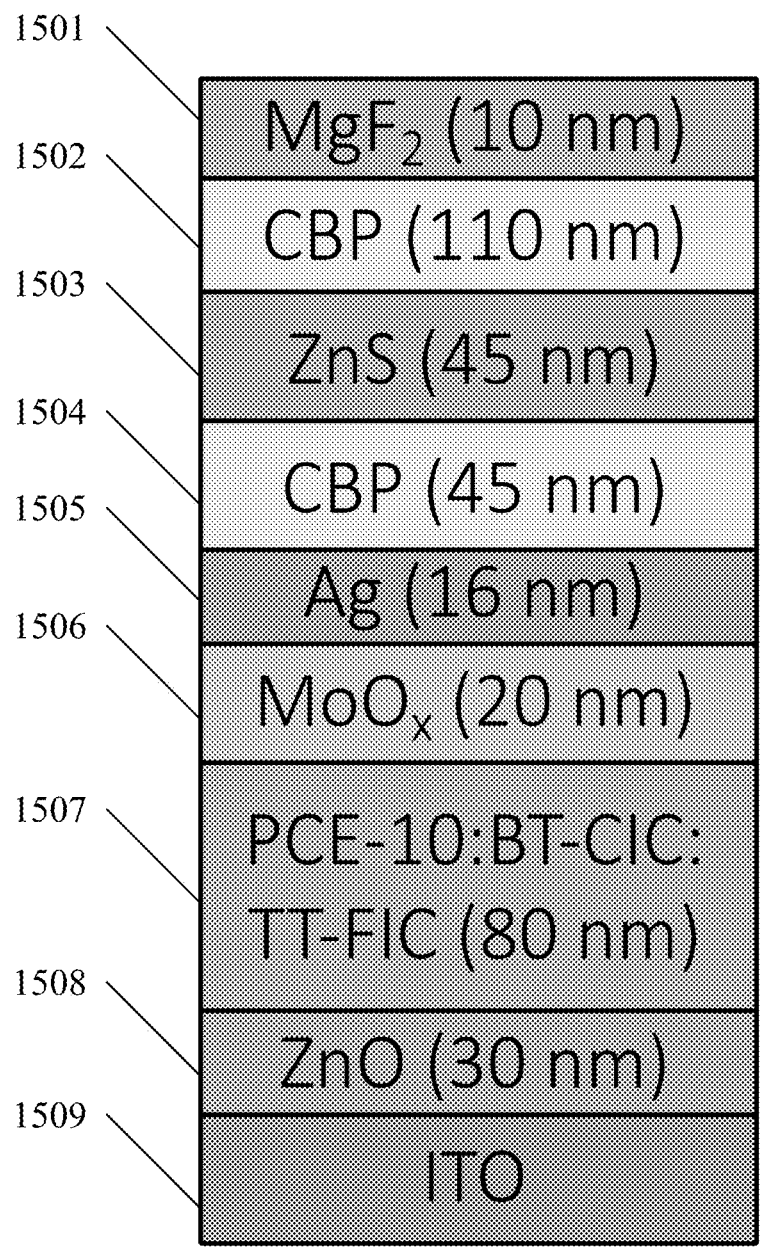
FIG. 15 is a schematic of a neutral color ST-OPV device.
Figure 16A:
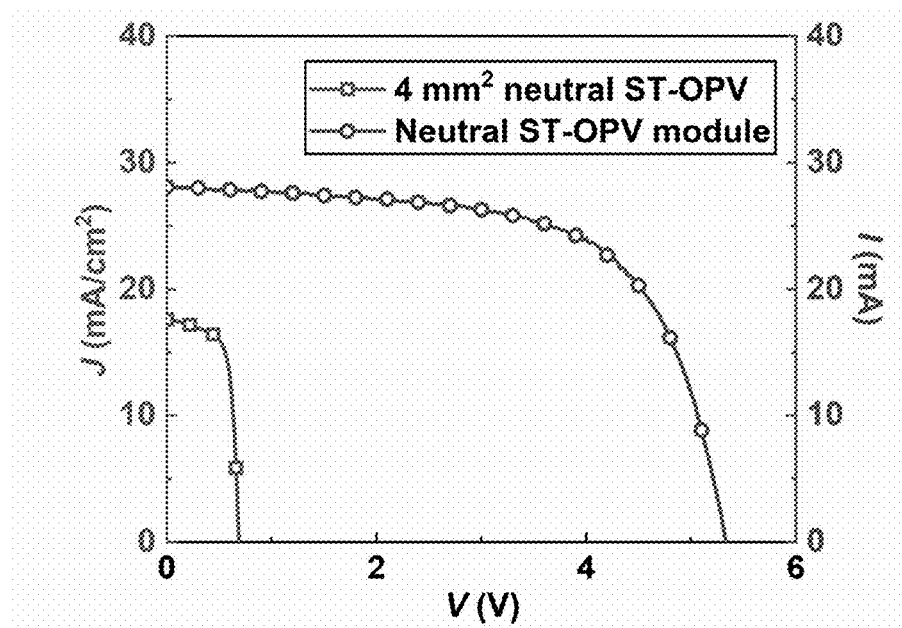
FIG. 16A is a graph of J-V and I-V characteristics of a 4 mm$^2$ neutral color ST-OPV device and module.
Figure 16B:
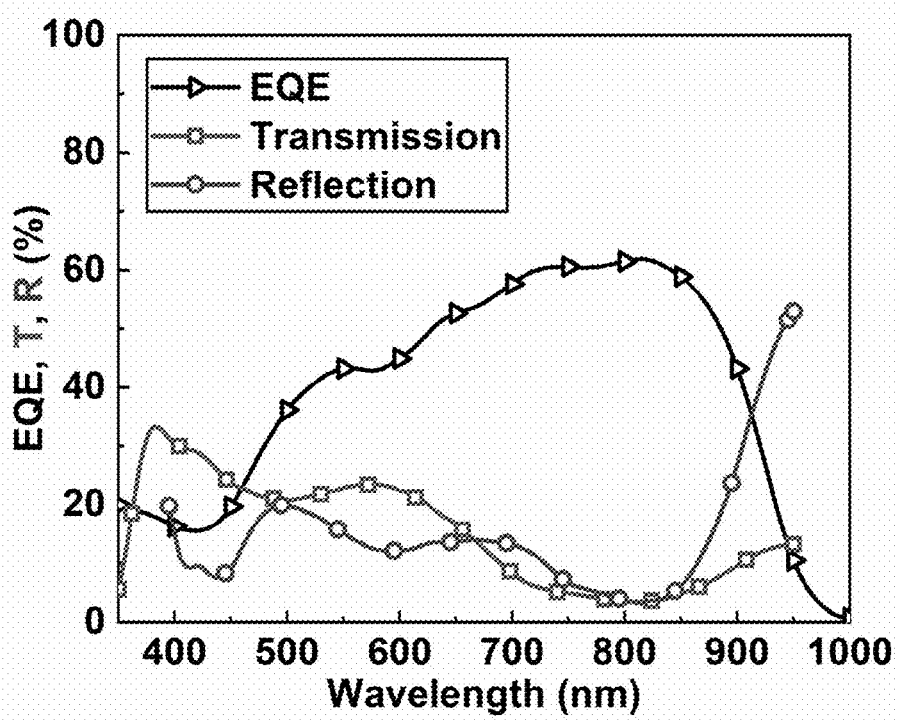
FIG. 16B is a graph of EQE, transmission and reflection spectra of the neutral color ST-OPV.
Figure 16C:
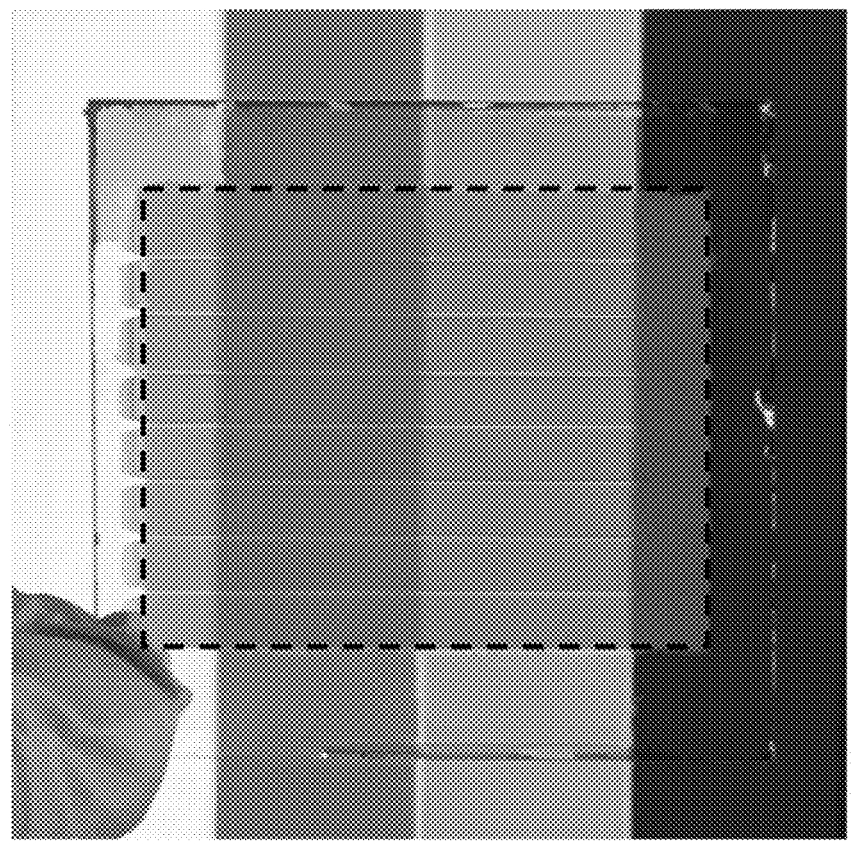
FIG. 16C is a photographic image of a prototype, neutral color ST-OPV module.

To realize neutral color ST-OPV modules, a 4-layer optical structure was used as shown in FIG. 15, including CBP (45 nm) (1504)/ZnS (45 nm) (1503)/CBP (110 nm) (1502)/MgF$_2$ (10 nm) (1501), whose J-V and I-V characteristics are shown in FIG. 16A, with detailed performance parameters listed in Table 1 above. The module exhibited $I_{SC}$=27.6±0.4 mA, $V_{OC}$=5.34±0.02 V and FF=0.64±0.01, which yielded PCE=7.4±0.2%. The EQE, transmission and reflection spectra are plotted in FIG. 16B. Compared to the device without the OC structure, the transmission of neutral color ST-OPV decreases between λ=400 nm and 500 nm, and increases between 550 nm and 650 nm, to reach a balance over the visible region. The neutral color module achieves (L*, a*, b*)=(53.7, −1.9, −3.9), a high color rendering index of 88, and a correlated color temperature of 5944 K, which is close to the solar surface temperature of 5776K. The APT and LUE of the module is 22.8±1.3% and 1.7±0.1%, respectively. FIG. 16C shows a photographic image with the module area bordered by a black dashed box. The illumination through the module can accurately render the colors of white, red, green and blue in the background.

CONCLUSION

The present experimental example introduced a peel-off patterning technique that can achieve micron-scale patterning resolution of organic materials without introducing damage incurred using conventional photolithography. Using this method, prototype, series-connected OPV modules were fabricated with 12.8 cm$^2$ active area and GFF=95.8%. An opaque OPV module was demonstrated with PCE=10.3±0.3%. ST-OPV modules were fabricated by utilizing ultrathin Ag top electrode and an OC structure. The optimized ST-OPV module achieves LUE=3.1±0.1% with PCE=7.3±0.2% and APT=41.8±1.4%. Furthermore, a neutral color ST-OPV module was demonstrated with LUE=1.7±0.1% and (L*, a*, b*)=(53.7, −1.9, −3.9). The peel-off patterning technique introduces the possibility for realizing ST-OPV modules with high efficiency and GFF approaching 100% over large areas. The disclosed result is general in that it shows a potential path for multilevel patterning of chemically sensitive materials over large areas with photolithographic resolution.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

REFERENCES

The following publications are incorporated herein by reference in their entireties:

Che, X., Li, Y., Qu, Y., and Forrest, S. R. (2018). High fabrication yield organic tandem photovoltaics combining vacuum- and solution-processed subcells with 15% efficiency. Nat. Energy 3, 422-427.

Meng, L., Zhang, Y., Wan, X., Li, C., Zhang, X., Wang, Y., Ke, X., Xiao, Z., Ding, L., Xia, R., et al. (2018). Organic and solution-processed tandem solar cells with 17.3% efficiency. Science 361, 1094-1098.

Cui, Y., Yao, H., Zhang, J., Xian, K., Zhang, T., Hong, L., Wang, Y., Xu, Y., Ma, K., An, C., et al. (2020). Single-Junction Organic Photovoltaic Cells with Approaching 18% Efficiency. Adv. Mater. 32.

Cui, Y., Xu, Y., Yao, H., Bi, P., Hong, L., Zhang, J., Zu, Y., Zhang, T., Qin, J., Ren, J., et al. (2021). Single-Junction Organic Photovoltaic Cell with 19% Efficiency. Adv. Mater. 33, 2102420.

Burlingame, Q., Huang, X., Liu, X., Jeong, C., Coburn, C., and Forrest, S. R. (2019). Intrinsically stable organic solar cells under high-intensity illumination. Nature 573, 394-397.

Li, Y., Huang, X., Ding, K., Sheriff, H. K. M., Ye, L., Liu, H., Li, C.-Z., Ade, H., and Forrest, S. R. (2021). Non-fullerene acceptor organic photovoltaics with intrinsic operational lifetimes over 30 years. Nat. Commun. 2021 121 12, 1-9.

Lunt, R. R., and Bulovic, V. (2011). Transparent, near-infrared organic photovoltaic solar cells for window and energy-scavenging applications. Appl. Phys. Lett. 98, 113305.

Meiss, J., Holzmueller, F., Gresser, R., Leo, K., and Riede, M. (2011). Near-infrared absorbing semitransparent organic solar cells. Appl. Phys. Lett. 99, 10-13.

Li, Y., Lin, J. D., Che, X., Qu, Y., Liu, F., Liao, L. S., and Forrest, S. R. (2017). High Efficiency Near-Infrared and Semitransparent Non-Fullerene Acceptor Organic Photovoltaic Cells. J. Am. Chem. Soc. 139, 17114-17119.

Li, Y., Ji, C., Qu, Y., Huang, X., Hou, S., Li, C. Z., Liao, L. S., Guo, L. J., and Forrest, S. R. (2019). Enhanced Light Utilization in Semitransparent Organic Photovoltaics Using an Optical Outcoupling Architecture. Adv. Mater. 31, 1903173.

Li, Y., Guo, X., Peng, Z., Qu, B., Yan, H., Ade, H., Zhang, M., and Forrest, S. R. (2020). Color-neutral, semitransparent organic photovoltaics for power window applications. Proc. Natl. Acad. Sci. U.S.A 117, 21147-21154.

Liu, Q., Gerling, L. G., Bernal-Texca, F., Toudert, J., Li, T., Zhan, X., and Martorell, J. (2020). Light Harvesting at Oblique Incidence Decoupled from Transmission in Organic Solar Cells Exhibiting 9.8% Efficiency and 50% Visible Light Transparency. Adv. Energy Mater.

Bai, Y., Zhao, C., Chen, X., Zhang, S., Zhang, S., Hayat, T., Alsaedi, A., Tan, Z., Hou, J., and Li, Y. (2019). Interfacial engineering and optical coupling for multicolored semitransparent inverted organic photovoltaics with a record efficiency of over 12%. J. Mater. Chem. A 7, 15887-15894.

Wang, D., Qin, R., Zhou, G., Li, X., Xia, R., Li, Y., Zhan, L., Zhu, H., Lu, X., Yip, H. L., et al. (2020). High-Performance Semitransparent Organic Solar Cells with Excellent Infrared Reflection and See-Through Functions. Adv. Mater. 32, 2001621.

H K M Sheriff, Y. L. B. Q. S. F. (2021). Aperiodic optical coatings for neutral-color semi-transparent organic photovoltaics. Appl. Phys. Lett. 118, 033302.

Jeong, H. I., Biswas, S., Yoon, S. C., Ko, S.-J., Kim, H., and Choi, H. (2021). Rational Design of Highly Efficient Semi-Transparent Organic Photovoltaics with Silver Nanowire Top Electrode via 3D Optical Simulation Study. Adv. Energy Mater., 2102397.

Huang, X., Zhang, L., Cheng, Y., Oh, J., Li, C., Huang, B., Zhao, L., Deng, J., Zhang, Y., Liu, Z., et al. (2021). Novel Narrow Bandgap Terpolymer Donors Enables Record Performance for Semitransparent Organic Solar Cells Based on All-Narrow Bandgap Semiconductors. Adv. Funct. Mater., 2108634.

Huang, X., Fan, D., and Forrest, S. R. (2021). Scalable semitransparent prototype organic photovoltaic module with minimal resistance loss. Org. Electron. 97, 106276.

Lim, D. C., Jeong, J. H., Hong, K., Nho, S., Lee, J.-Y., Hoang, Q. V., Lee, S. K., Pyo, K., Lee, D., and Cho, S. (2018). Semi-transparent plastic solar cell based on oxide-metal-oxide multilayer electrodes. Prog. Photovoltaics Res. Appl. 26, 188-195.

Dong, S., Jia, T., Zhang, K., Jing, J., and Huang, F. (2020). Single-Component Non-halogen Solvent-Processed High-Performance Organic Solar Cell Module with Efficiency over 14%. Joule 4, 2004-2016.

Heo, Y.-J., Jung, Y.-S., Hwang, K., Kim, J.-E., Yeo, J.-S., Lee, S., Jeon, Y.-J., Lee, D., and Kim, D.-Y. (2017). Small-Molecule Organic Photovoltaic Modules Fabricated via Halogen-Free Solvent System with Roll-to-Roll Compatible Scalable Printing Method. ACS Appl. Mater. Interfaces 9, 39519-39525.

Kutsarov, D. I., New, E., Bausi, F., Zoladek-Lemanczyk, A., Castro, F. A., and Silva, S. R. P. (2017). Fabrication of air-stable, large-area, PCDTBT:PC70BM polymer solar cell modules using a custom built slot-die coater. Sol. Energy Mater. Sol. Cells 161, 388-396.

Bernardo, G., Lopes, T., Lidzey, D. G., and Mendes, A. (2021). Progress in Upscaling Organic Photovoltaic Devices. Adv. Energy Mater. 11.

Wang, G., Adil, M. A., Zhang, J., and Wei, Z. (2019). Large-Area Organic Solar Cells: Material Requirements, Modular Designs, and Printing Methods. Adv. Mater. 31, 1-34.

Chen, H., Zhang, R., Chen, X., Zeng, G., Kobera, L., Abbrent, S., Zhang, B., Chen, W., Xu, G., Oh, J., et al. (2021). A guest-assisted molecular-organization approach for >17% efficiency organic solar cells using environmentally friendly solvents. Nat. Energy 2021 611 6, 1045-1053.

Lucera, L., Machui, F., Schmidt, H. D., Ahmad, T., Kubis, P., Strohm, S., Hepp, J., Vetter, A., Egelhaaf, H. J., and Brabec, C. J. (2017). Printed semi-transparent large area organic photovoltaic modules with power conversion efficiencies of close to 5%. Org. Electron. 45, 209-214.

Kubis, P., Li, N., Stubhan, T., Machui, F., Matt, G. J., Voigt, M. M., and Brabec, C. J. (2015). Patterning of organic photovoltaic modules by ultrafast laser. Prog. Photovoltaics Res. Appl. 23, 238-246.

Strohm, S., Machui, F., Langner, S., Kubis, P., Gasparini, N., Salvador, M., McCulloch, I., Egelhaaf, H. J., and Brabec, C. J. (2018). P3HT: Non-fullerene acceptor based large area, semi-transparent PV modules with power conversion efficiencies of 5%, processed by industrially scalable methods. Energy Environ. Sci. 11, 2225-2234.

Distler, A., Brabec, C. J., and Egelhaaf, H. J. (2021). Organic photovoltaic modules with new world record efficiencies. Prog. Photovoltaics Res. Appl. 29, 24-31.

Pascual-San-José, E., Sadoughi, G., Lucera, L., Stella, M., Martinez-Ferrero, E., Morse, G. E., Campoy-Quiles, M., and Burgués-Ceballos, I. (2020). Towards photovoltaic windows: Scalable fabrication of semitransparent modules based on non-fullerene acceptorsvialaser-patterning. J. Mater. Chem. A 8, 9882-9895.

Lucera, L., Machui, F., Kubis, P., Schmidt, H. D., Adams, J., Strohm, S., Ahmad, T., Forberich, K., Egelhaaf, H. J., and Brabec, C. J. (2016). Highly efficient, large area, roll coated flexible and rigid OPV modules with geometric fill factors up to 98.5% processed with commercially available materials. Energy Environ. Sci. 9, 89-94.

Dong, X., Jiang, Y., Sun, L., Qin, F., Zhou, X., Lu, X., Wang, W., Zhou, Y., Dong, X. Y., Jiang, Y. Y., et al. (2021). Large-Area Organic Solar Modules with Efficiency Over 14%. Adv. Funct. Mater., 2110209.

Ilic, B., and Craighead, H. G. (2000). Topographical patterning of chemically sensitive biological materials using a polymer-based dry lift off. Biomed. Microdevices 2, 317-322.

Tan, C. P., Ri Seo, B., Brooks, D. J., Chandler, E. M., Craighead, H. G., and Fischbach, C. (2009). Parylene peel-off arrays to probe the role of cell-cell interactions in tumour angiogenesis. Integr. Biol. 1, 587-594.

Tan, C. P., Cipriany, B. R., Lin, D. M., and Craighead, H. G. (2010). Nanoscale Resolution, Multicomponent Biomolecular Arrays Generated By Aligned Printing With Parylene Peel-Off. Nano Lett. 10, 719-725.

Martinez, D., Py, C., Denhoff, M., Monette, R., Comas, T., Krantis, A., and Mealing, G. (2013). Polymer peel-off mask for high-resolution surface derivatization, neuron placement and guidance. Biotechnol. Bioeng. 110, 2236-2241.

Defranco, J. A., Schmidt, B. S., Lipson, M., and Malliaras, G. G. (2006). Photolithographic patterning of organic electronic materials. Org. Electron. 7, 22-28.

Abbas, A. S., Alqarni, S., Shokouhi, B. B., Abbas, A. S., Yavuz, M., and Cui, B. (2014). Metal and organic nanostructure fabrication by electron beam lithography and dry liftoff. Proc. IEEE Conf. Nanotechnol., 392-395.

Zou, C., Chang, C., Sun, D., Bohringer, K. F., and Lin, L. Y. (2020). Photolithographic patterning of perovskite thin films for multicolor display applications. Nano Lett. 20, 3710-3717.

Rowell, M. W., and McGehee, M. D. (2011). Transparent electrode requirements for thin film solar cell modules. Energy Environ. Sci. 4, 131-134.

Lucera, L., Kubis, P., Fecher, F. W., Bronnbauer, C., Turbiez, M., Forberich, K., Ameri, T., Egelhaaf, H. J., and Brabec, C. J. (2015). Guidelines for Closing the Efficiency Gap between Hero Solar Cells and Roll-To-Roll Printed Modules. Energy Technol. 3, 373-384.

What is claimed is:

1. A method of fabricating an organic optoelectronic device, comprising:
    positioning a patterning layer over a substrate;
    etching the patterning layer using a photolithographic process to create an etched patterning layer;
    positioning a layer of organic material over the etched patterning layer; and
    lifting off at least a portion of the etched patterning layer and at least a portion of the layer of the organic material positioned over the portion of the etched patterning layer to create a patterned organic layer over the substrate.

2. The method of claim 1, wherein the etched patterning layer includes a portion having a width of between 1 μm and 10 mm.

3. The method of claim 1, wherein the etched patterning layer comprises a void having a width of between 1 μm and 10 mm.

4. The method of claim 1, wherein the patterning layer comprises a polymer.

5. The method of claim 1, further comprising applying a surface treatment in an interface between the substrate and the patterning layer.

6. The method of claim 1, wherein the etching step comprises the steps of:
- positioning a photoresist layer over the patterning layer;
- positioning a mask over the photoresist layer;
- exposing a portion of the photoresist layer to light through the mask; and
- removing at least a portion of the patterning layer.

7. The method of claim 1, further comprising positioning a second electrode over the patterned organic layer.

8. The method of claim 7, further comprising the step of removing a second portion of the patterning layer and a portion of the second electrode to create a patterned second electrode over the substrate.

9. The method of claim 8, wherein a portion of the patterned second electrode is electrically connected to a portion of the first electrode.

10. The method of claim 1, wherein the patterning layer comprises a thin strip of material having a width of less than 100 μm.

11. An organic photovoltaic cell made using the method of claim 1.

12. The method of claim 1,
wherein the substrate is a first electrode layer;
wherein the etched patterning layer comprises at least one pair of thin strips comprising first and second thin strips with a separation between the first and second strips;
wherein the organic material comprises a heterojunction layer;
wherein the portion of the etched patterning layer comprises the first thin strip of each of the at least one pair of thin strips; and
wherein the method further comprises the steps of:
depositing a second electrode over the heterojunction layer; and
lifting off the second thin strip of each of the at least one pair of thin strips, removing a portion of the second electrode.

13. The method of claim 12, further comprising applying a surface treatment at an interface between the patterning layer and the first electrode layer.

14. The method of claim 12, wherein each thin strip of the at least one pair of thin strips have a width of less than 100 μm.

15. The method of claim 14, wherein the separation between the first and second thin strips in the at least one pair of thin strips is less than 100 μm.

16. The method of claim 12, wherein the first electrode layer is a cathode and the second electrode layer is an anode.

17. The method of claim 16, wherein the step of lifting off at least the portion of the etched patterning layer and at least the portion of the layer of the organic material positioned over the portion of the etched patterning later to create the patterned organic layer of the substrate or the step of lifting off the second thin strip of each of the at least one pair of thin strips, removing the portion of the second electrode comprises rolling at least one of the portion of the etched patterning layer, the portion of the layer of the organic material, and the second thin strip of the at least one pair of thin strips onto a roller and moving the roller along a plane parallel to the first electrode layer.

18. The method of claim 12, wherein at least a portion of the second electrode layer is electrically connected to at least a portion of the first electrode layer.

19. The method of claim 10, wherein the thin strip of material is connected at a distal end to a wedge-shaped handle, the wedge-shaped handle having a tapered shape at a proximal end beginning with a width of at least ten times the width of the thin strip and ending with a width at the distal end equal to the width of the thin strip of material.

20. The method of claim 1, wherein the portion of the etched patterning layer is lifted off via an upward force.

* * * * *